(12) United States Patent
Chen

(10) Patent No.: US 10,685,899 B2
(45) Date of Patent: Jun. 16, 2020

(54) CONDUCTIVE LID AND SEMICONDUCTOR DEVICE PACKAGE

(71) Applicant: Advanced Semiconductor Engineering, Inc., Kaohsiung (TW)

(72) Inventor: Hsin-En Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/156,984

(22) Filed: Oct. 10, 2018

(65) Prior Publication Data
US 2020/0118905 A1 Apr. 16, 2020

(51) Int. Cl.
H01L 23/367 (2006.01)
H01L 23/40 (2006.01)
F28F 13/06 (2006.01)

(52) U.S. Cl.
CPC .......... *H01L 23/3675* (2013.01); *F28F 13/06* (2013.01); *H01L 23/4006* (2013.01); *H01L 2023/4031* (2013.01); *H01L 2023/4068* (2013.01); *H01L 2023/4087* (2013.01)

(58) Field of Classification Search
CPC combination set(s) only.
See application file for complete search history.

(56) References Cited

U.S. PATENT DOCUMENTS

| | | | |
|---|---|---|---|
| 7,441,590 B2 * | 10/2008 | Yano | H01L 23/467 165/122 |
| 7,704,791 B2 | 4/2010 | Dubin et al. | |
| 8,018,072 B1 | 9/2011 | Miks et al. | |
| 2005/0199370 A1 * | 9/2005 | Huang | H01L 23/4093 165/80.3 |
| 2009/0045503 A1 | 2/2009 | Koduri | |

* cited by examiner

Primary Examiner — Sonya D. McCall-Shepard
(74) Attorney, Agent, or Firm — Foley & Lardner LLP

(57) ABSTRACT

A conductive lid includes a body including a first portion extended from the body and bent toward a first direction; a second portion extended from the body and bent toward the first direction; and a third portion extended from the second portion and bent toward a second direction different from the first direction.

20 Claims, 27 Drawing Sheets

CONDUCTIVE LID AND SEMICONDUCTOR DEVICE PACKAGE

BACKGROUND

1. Field of the Disclosure

The present disclosure relates to a semiconductor device package. More particularly, the present disclosure relates to a semiconductor device package with a conductive lid.

2. Description of the Related Art

A semiconductor device package may include a semiconductor device on a carrier/substrate. A heat sink/spreader is used to dissipate heat from the semiconductor device package. The heat sink/spreader may be in thermal contact with the semiconductor device and or the substrate for heat dissipation. However, bonding between the heat sink/spreader and the semiconductor device may be vulnerable. Moreover, the heat generated by the semiconductor device package may not be timely dissipated, which may damage the semiconductor device package.

SUMMARY

In some embodiments, a conductive lid comprises a body. The body comprises a first portion, a second portion, and a third portion. The first portion is extended from the body and bent toward a first direction. The second portion is extended from the body and bent toward the first direction. The third portion is extended from the second portion and bent toward a second direction different from the first direction.

In some embodiments, a semiconductor device package comprises a semiconductor component, a substrate, and a conductive lid. The semiconductor component is disposed over the substrate. The conductive lid is disposed over the semiconductor component and comprises a body. The body comprises a first portion extended from the body and bent toward a first direction, a second portion extended from the body and bent toward the first direction, and a third portion extended from the second portion and bent toward a second direction different from the first direction.

In some embodiments, a semiconductor device package comprises a semiconductor component, a first substrate, a second substrate and a conductive lid. The semiconductor component is disposed over the first substrate. The first substrate is disposed over the second substrate. The conductive lid comprises a body. The body comprises a first portion extended from the body and bent toward a first direction, a second portion extended from the body and bent toward the first direction, and a third portion extended from the second portion and bent toward a second direction different from the first direction. The first portion is connected to the first substrate, and the third portion is connected to the second substrate.

Other aspects and embodiments of the present disclosure are also contemplated. The foregoing summary and the following detailed description are not meant to limit the present disclosure to any particular embodiment but are merely meant to describe some embodiments of the present disclosure.

BRIEF DESCRIPTION OF THE DRAWINGS

For a better understanding of the nature and objects of some embodiments of the present disclosure, reference should be made to the following detailed description taken in conjunction with the accompanying drawings. In the drawings, identical/similar or functionally identical/similar elements are given the same reference numbers unless otherwise specified.

DETAILED DESCRIPTION

Figure 1A:
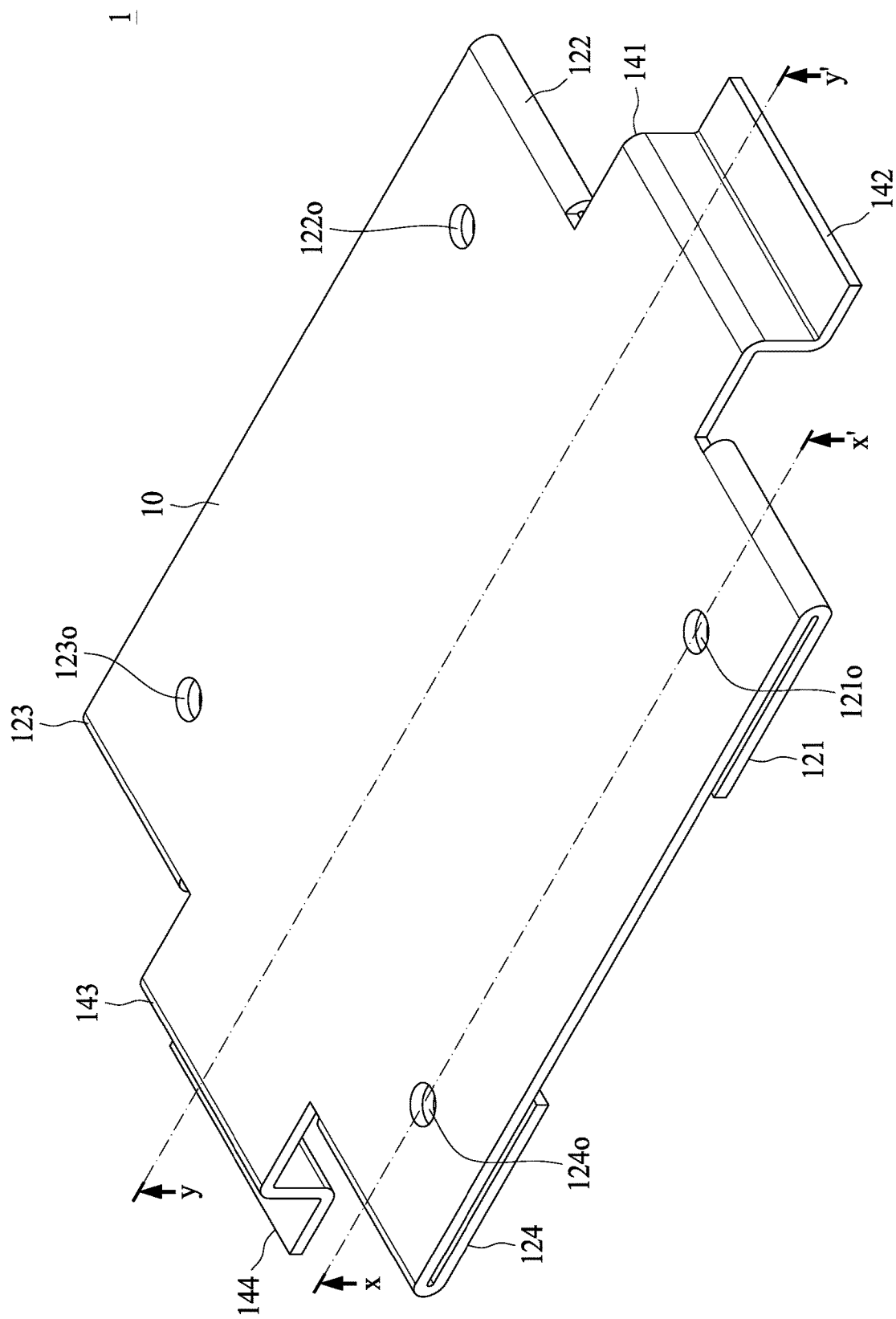
FIG. 1A illustrates a stereoscopic diagram of a conductive lid according to some embodiments of the present disclosure.
Figure 1B:
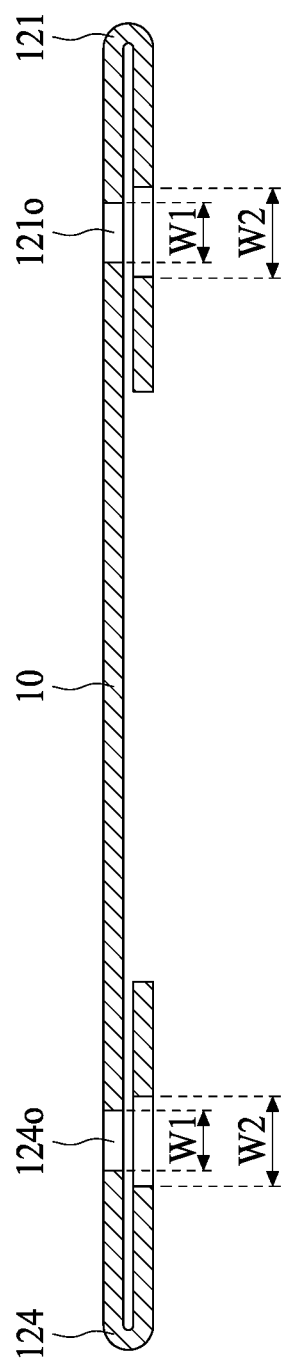
FIG. 1B illustrates a cross-sectional view of the conductive lid of FIG. 1A taken along line x-x'.
Figure 1C:
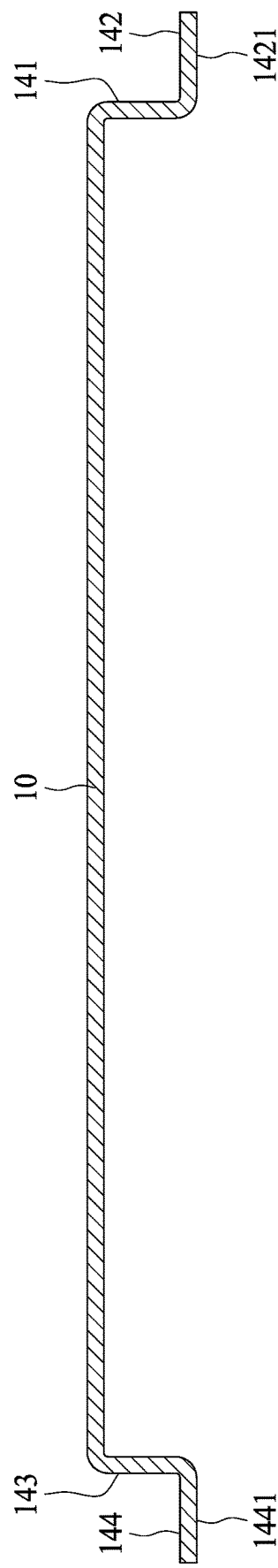
FIG. 1C illustrates a cross-sectional view of the conductive lid of FIG. 1A taken along line y-y'.
Figure 2A:
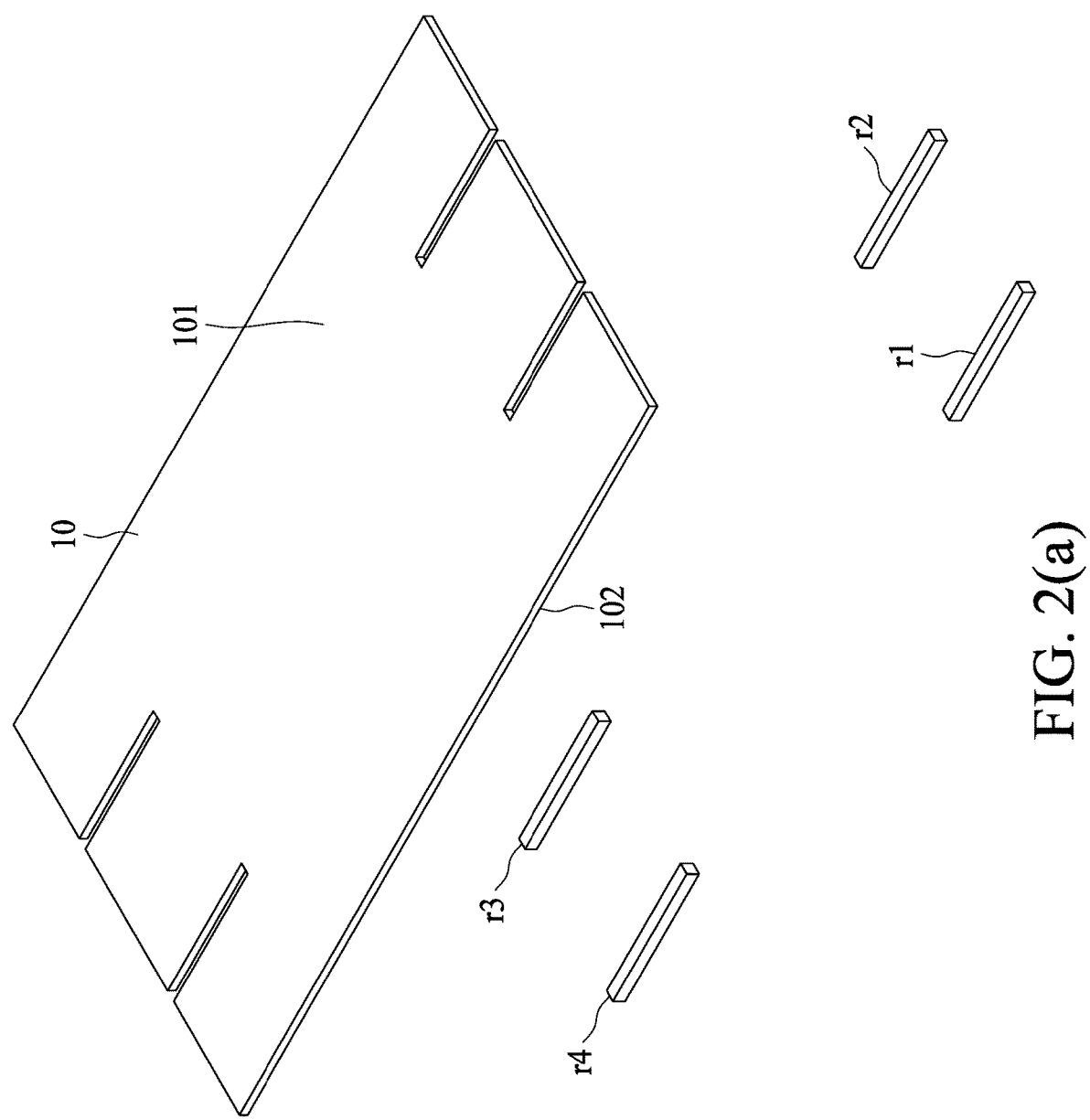
FIG. 2(a), FIG. 2(b), FIG. 2(c), FIG. 2(d), and FIG. 2(e) illustrate one or more stages of a method of manufacturing the conductive lid according to some embodiments of the present disclosure.
Figure 2B:
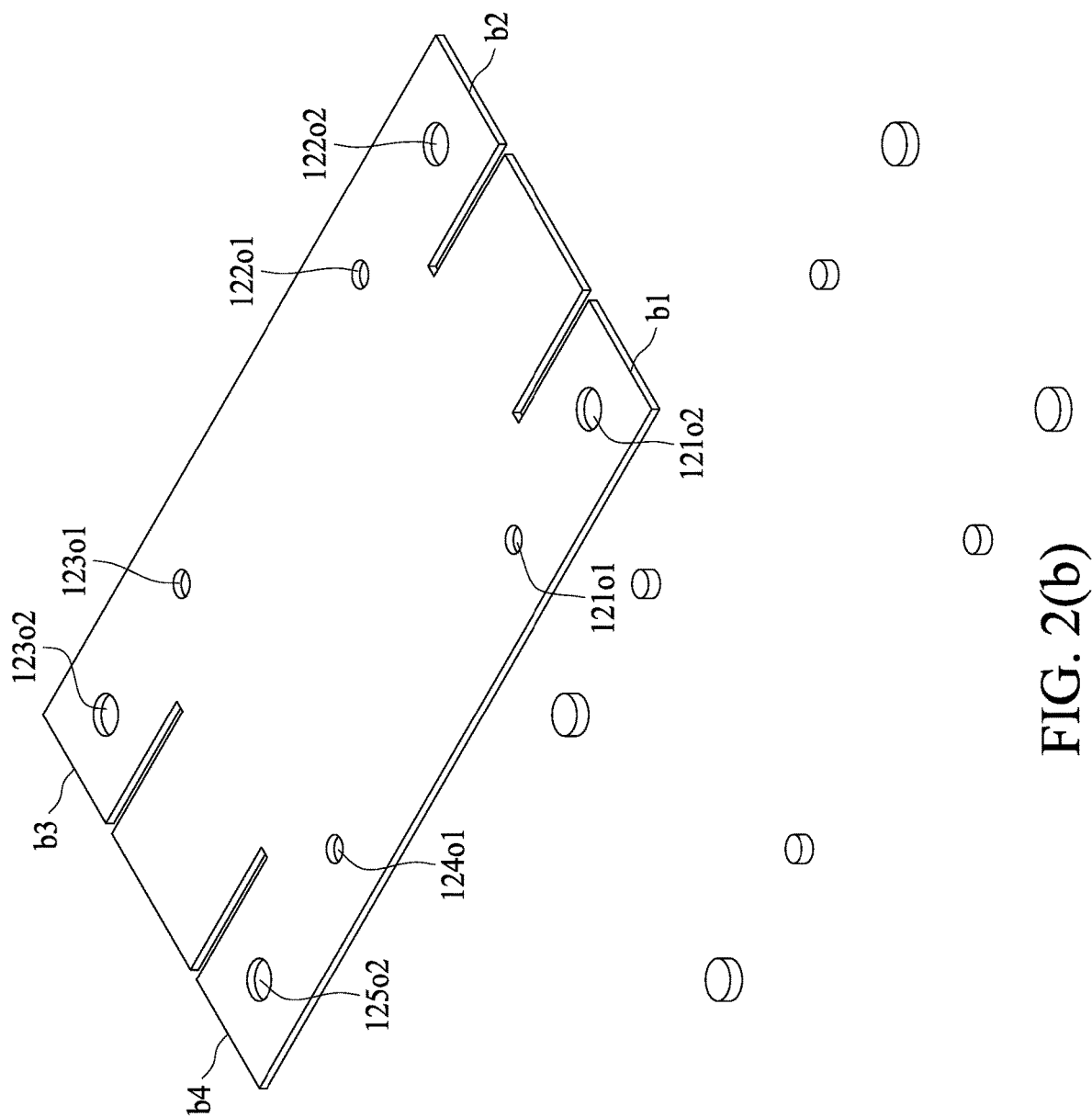
Figure 2C:
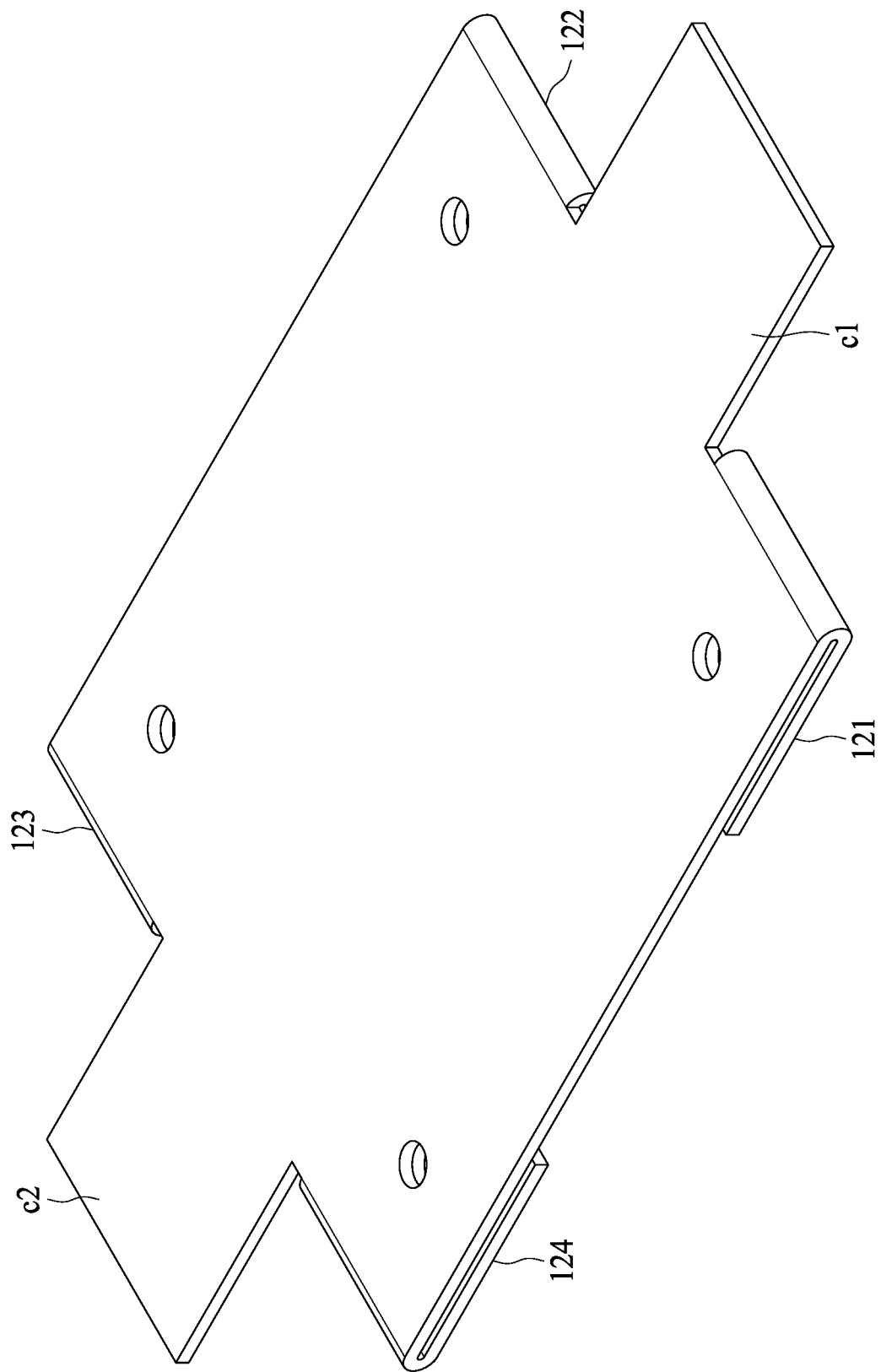
Figure 2D:
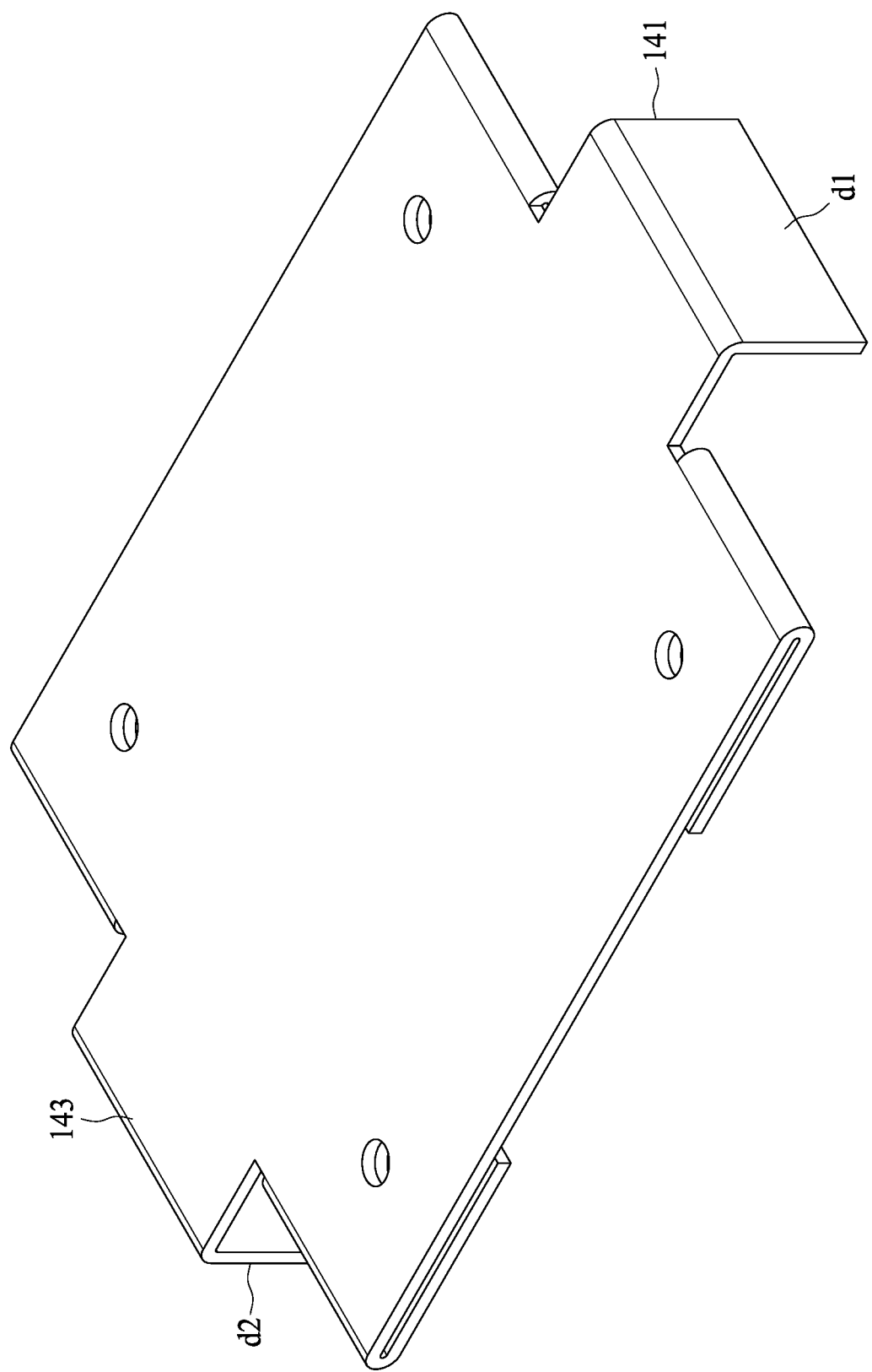
Figure 2E:
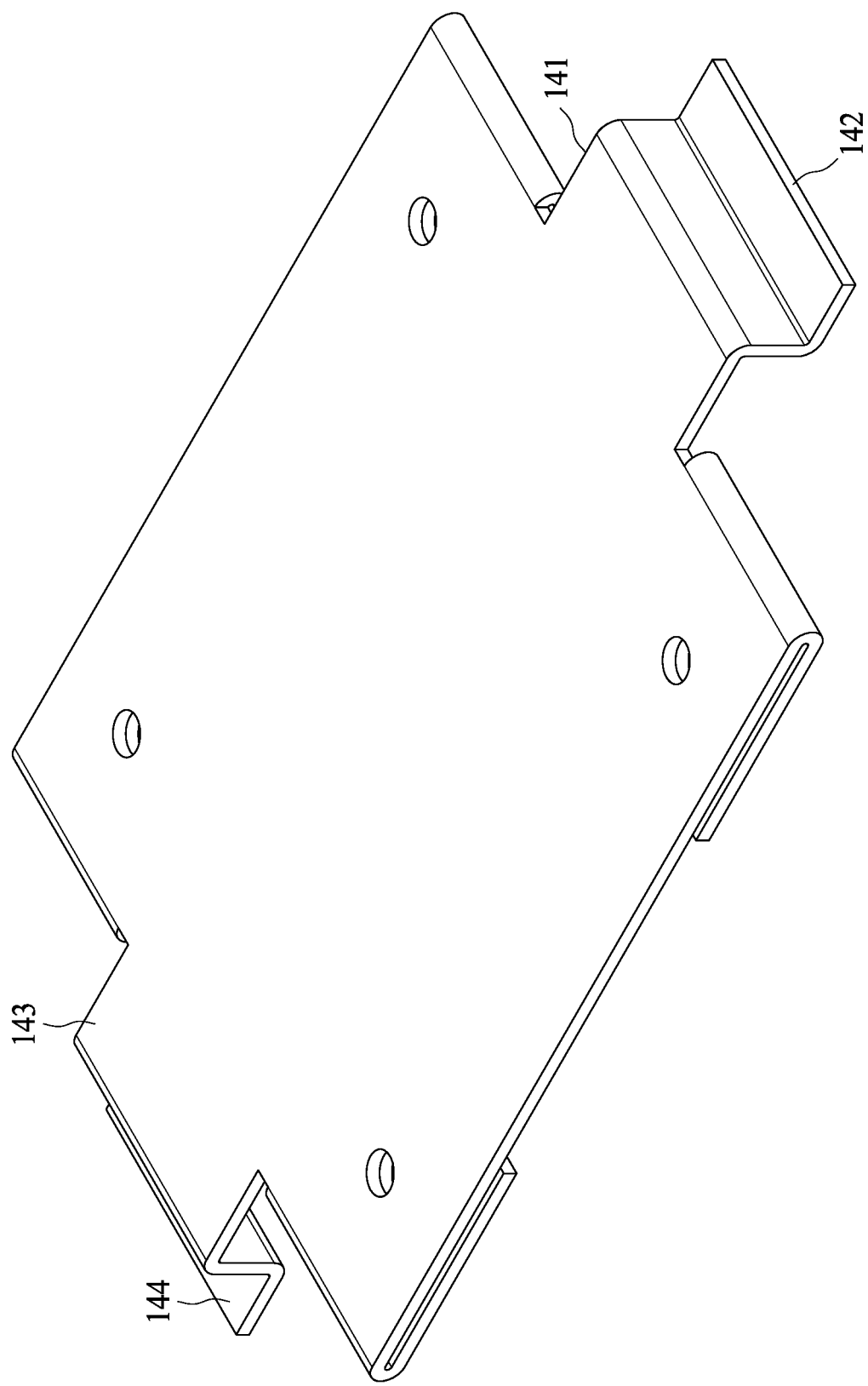

FIG. 1A illustrates a stereoscopic diagram of a conductive lid 1 according to some embodiments of the present disclosure. FIG. 1B illustrates a cross-sectional view of the conductive lid 1 of FIG. 1A taken along line x-x'. FIG. 1C illustrates a cross-sectional view of the conductive lid 1 of FIG. 1A taken along line y-y'. As shown in FIG. 1A, the conductive lid 1 comprises a body 10. The body 10 comprises portions 121, 122, 123 and 124. The portions 121 and 122 are extended from the body 10 and bent toward a clockwise direction. The portions 123 and 124 are extended from the body 10 and bent toward the counterclockwise direction. As shown in FIGS. 1A and 1B, the portions 121, 122, 123 and 124 are bent toward the bottom surface of the body 10. In some embodiment of the present disclosure, the portions 121, 122, 123 and 124 form a first type of heat dissipation contact portions. The body 10 further comprises portions 141, 142, 143 and 144. The portion 141 is extended from the body 10 and bent toward the clockwise direction. The portion 142 is extended from the second portion 141 and bent toward a counterclockwise direction. The portion 143 is extended from the body 10 and bent toward the counterclockwise direction. The portion 144 is extended from the portion 143 and bent toward the clockwise direction. As shown in FIGS. 1A and 1C, the portions 141 and 142 form a stepped shape and the portions 143 and 144 also form a stepped shape. In some embodiments of the present disclosure, the bottom surface of portions 142 and 144 can be connected to external contacts so as to form a second type of heat dissipation contact portions. In some embodiments, the thermal conductivity of the portions 141, 142, 143 and 144 is greater than the thermal conductivity of the portions 121, 122, 123 and 124.

In this embodiment, the conductive lid 1 comprises four holes 121*o*, 122*o*, 123*o* and 124*o* used for accommodating locking accessories (such as push pins, screws, DIP pins, card hoods and so on). As shown in FIG. 1A, the holes 121*o*, 122*o*, 123*o* and 124*o* are disposed on the portions 121, 122, 123 and 124, respectively. Please note that the number of holes on the conductive lid may be less than or more than four, which can be determined based on situational specifications and is not limited here. Referring to FIG. 1B, in this embodiment, the width W1 of the hole 1210 on the upper part of the portion 121 is less than the width W2 of the hole 1210 on the lower part of the portion 121. Similarly, the width W1 of the hole 124*o* on the upper part of the portion 124 is less than the width W2 of the hole 124*o* on the lower part of the portion 124. In this embodiment, the holes 121*o*, 122*o*, 123*o* and 124*o* are preferably used for accommodating push pins. In some embodiments, the width W1 of each of the holes on the upper part of the portions 121, 122, 123 and 124 may be equal to the width W2 of each of the holes on the lower part of the portions 121, 122, 123 and 124. In some further embodiments, the width W1 of each of the holes on the upper part of the portions 121, 122, 123 and 124 may be greater than the width W2 of each of the holes on the lower part of the portions 121, 122, 123 and 124. The widths W1 and W2 can be determined based on situational specifications and are not limited here.

FIGS. 2(*a*) to 2(*e*) illustrate one or more steps of a method of manufacturing the conductive lid 1 according to some embodiments of the present disclosure. Referring to FIG. 2(*a*), a body 10 having an upper surface 101 and a bottom surface 102 is provided, and then material release is performed on the body 10 by stamping. As shown in FIG. 2(*a*), the portions r1, r2, r3 and r4 are removed from the body 10.

The material of the body 10 of the conductive lid 1 can be, for example, copper, aluminum, aluminum alloy (such as aluminum alloy 1050, 1060, 6061, 5052, 7075 and so on), stainless steel or other metal materials. Referring to FIG. 2(*b*), further material release is performed on the body 10 by punching so as to form eight holes 121*o*1, 121*o*2, 122*o*1, 122*o*2, 123*o*1, 123*o*2, 124*o*1 and 124*o*2 on the body 10. In this embodiment, the size of the holes 121*o*1, 122*o*1, 123*o*1 and 124*o*1 is smaller than that of the holes 121*o*2, 122*o*2, 123*o*2 and 124*o*2. For example, the diameter of the holes 121*o*1, 122*o*1, 123*o*1 and 124*o*1 can be 3.5 mm and the diameter of holes 121*o*2, 122*o*2, 123*o*2 and 124*o*2 can be 4.5 mm. Referring to FIGS. 2(*b*) and 2(*c*), the portions 121, 122, 123 and 124 are formed by bending the portions b1, b2, b3 and b4 toward the bottom surface 102 of the body 10 such that the holes 121*o*1, 122*o*1, 123*o*1 and 124*o*1 are aligned with the holes 121*o*2, 122*o*2, 123*o*2 and 124*o*2, respectively. Referring to FIGS. 2(*c*) and 2(*d*), the portion 141 is formed by bending the portion c1 toward the clockwise direction, and the portion 143 is formed by bending the portion c2 toward the counterclockwise direction. Referring to FIGS. 2(*d*) and 2(*e*), the portion 142 is formed by bending the portion d1 toward the counterclockwise direction, and the portion 144 is formed by bending the portion d2 toward the clockwise direction. As shown in FIG. 2(*e*), the entire conductive lid 1 is formed. In some embodiments, the conductive lid 1 can be made by modulus of continuity.

Figure 3:
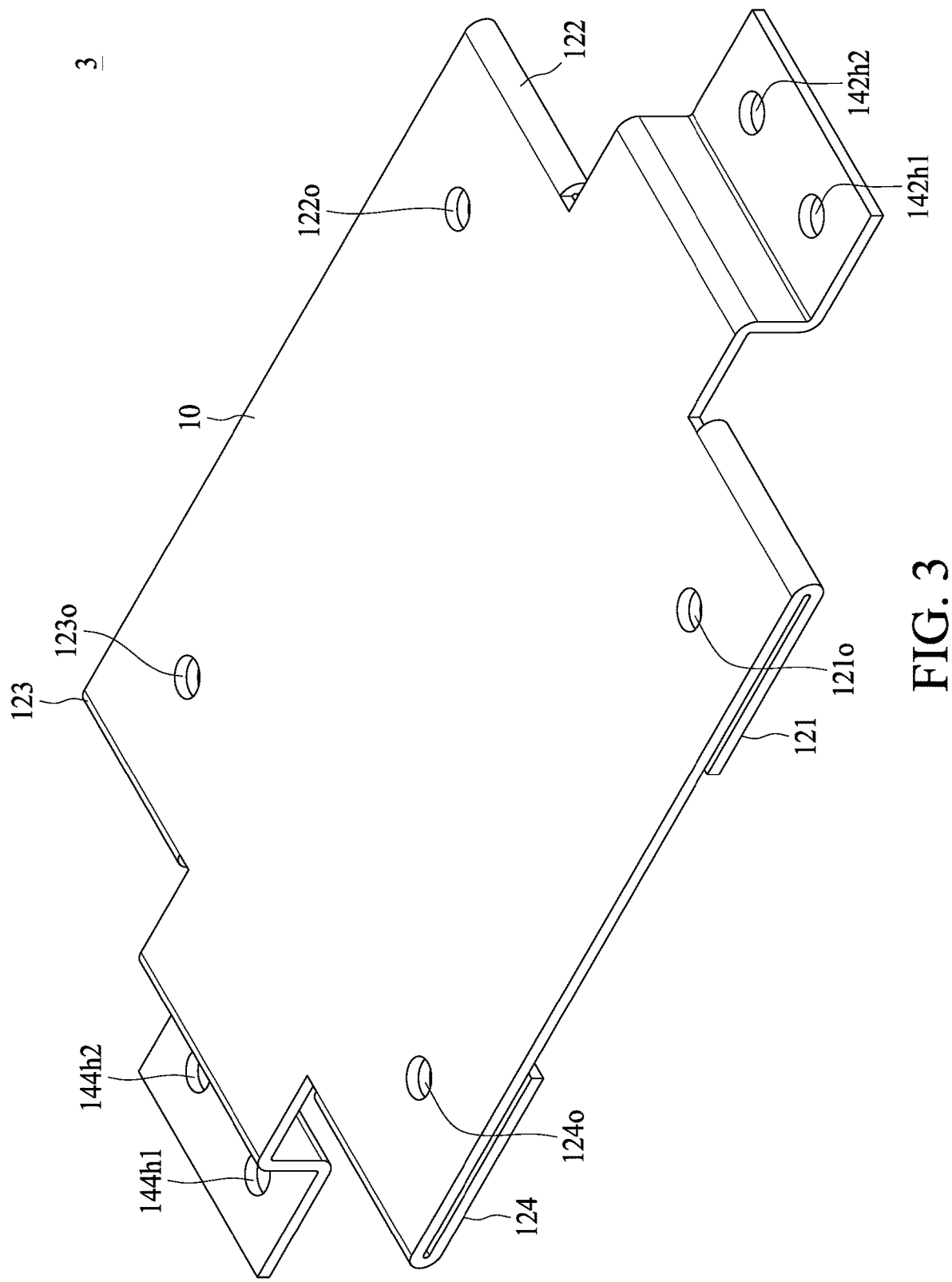
FIG. 3 illustrates a stereoscopic diagram of a conductive lid according to some embodiments of the present disclosure.

FIG. 3 illustrates a stereoscopic diagram of a conductive lid 3 according to some embodiments of the present disclosure. The conductive lid 3 shown in FIG. 3 is similar to the conductive lid 1 shown in FIG. 1. The difference between the conductive lid 3 shown in FIG. 3 and the conductive lid 1 shown in FIG. 1 is that the conductive lid 3 further includes holes 142*h*1 and 142*h*2 on the portion 142 and holes 144*h*1 and 144*h*2 on the portion 144. The holes 142*h*1, 142*h*2, 144*h*1 and 144*h*2 can be used for accommodating locking accessories.

Figure 4:
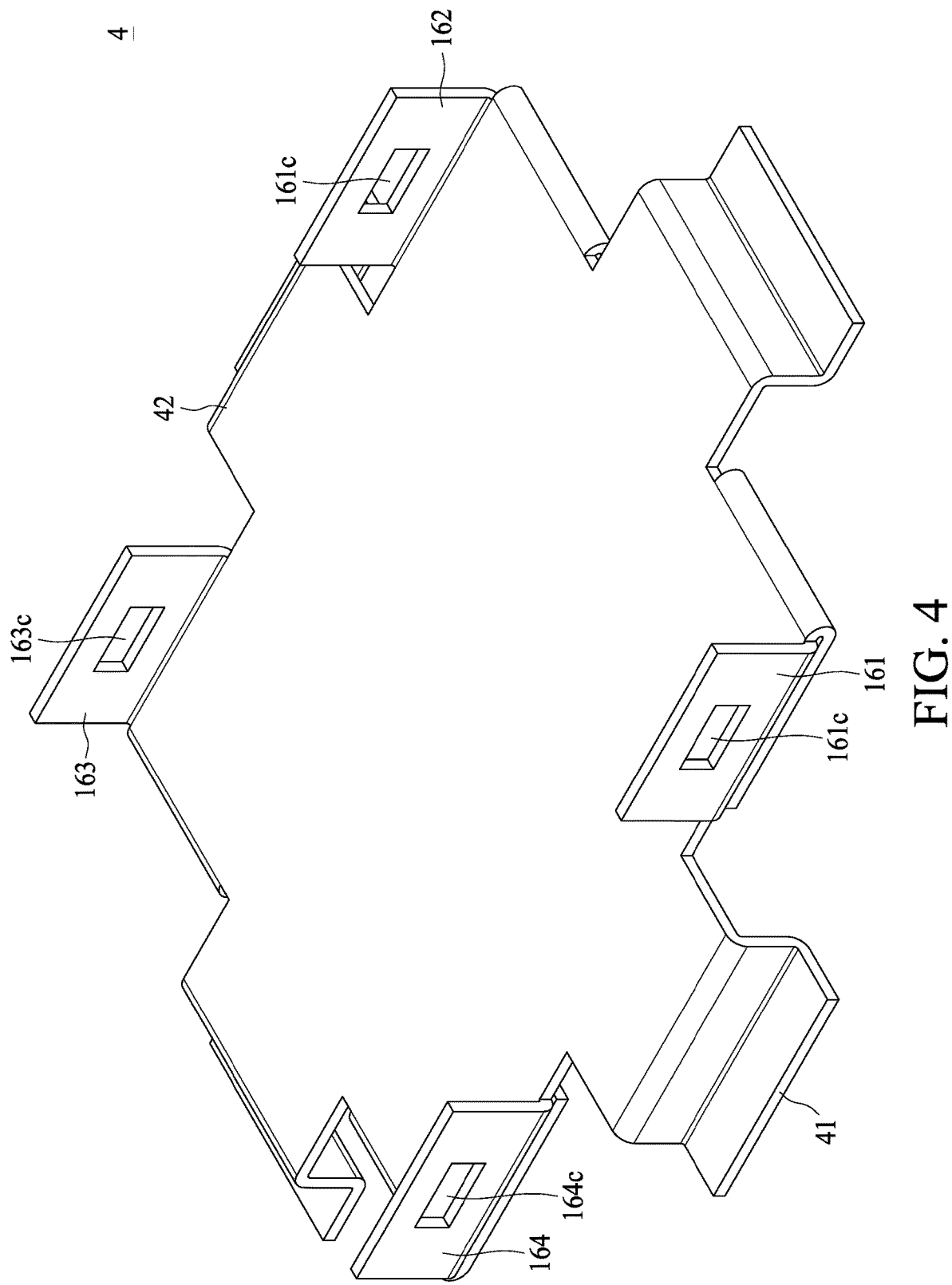
FIG. 4 illustrates a stereoscopic diagram of a conductive lid according to some embodiments of the present disclosure.

FIG. 4 illustrates a stereoscopic diagram of a conductive lid 4 according to some embodiments of the present disclosure. The conductive lid 4 shown in FIG. 4 is similar to the conductive lid 1 shown in FIG. 1. The differences between the conductive lid 4 shown in FIG. 4 and the conductive lid 1 shown in FIG. 1 are that the conductive lid 4 further comprises another two stepped portions 41 and 42 and that the conductive lid 4 further holders 161, 162, 163 and 164 which are bent substantially perpendicular to the body 10. As shown in FIG. 4, the holders 161, 162, 163 and 164 further comprise card hook structures 161*c*, 162*c*, 163*c* and 164*c*, respectively.

Figure 5:
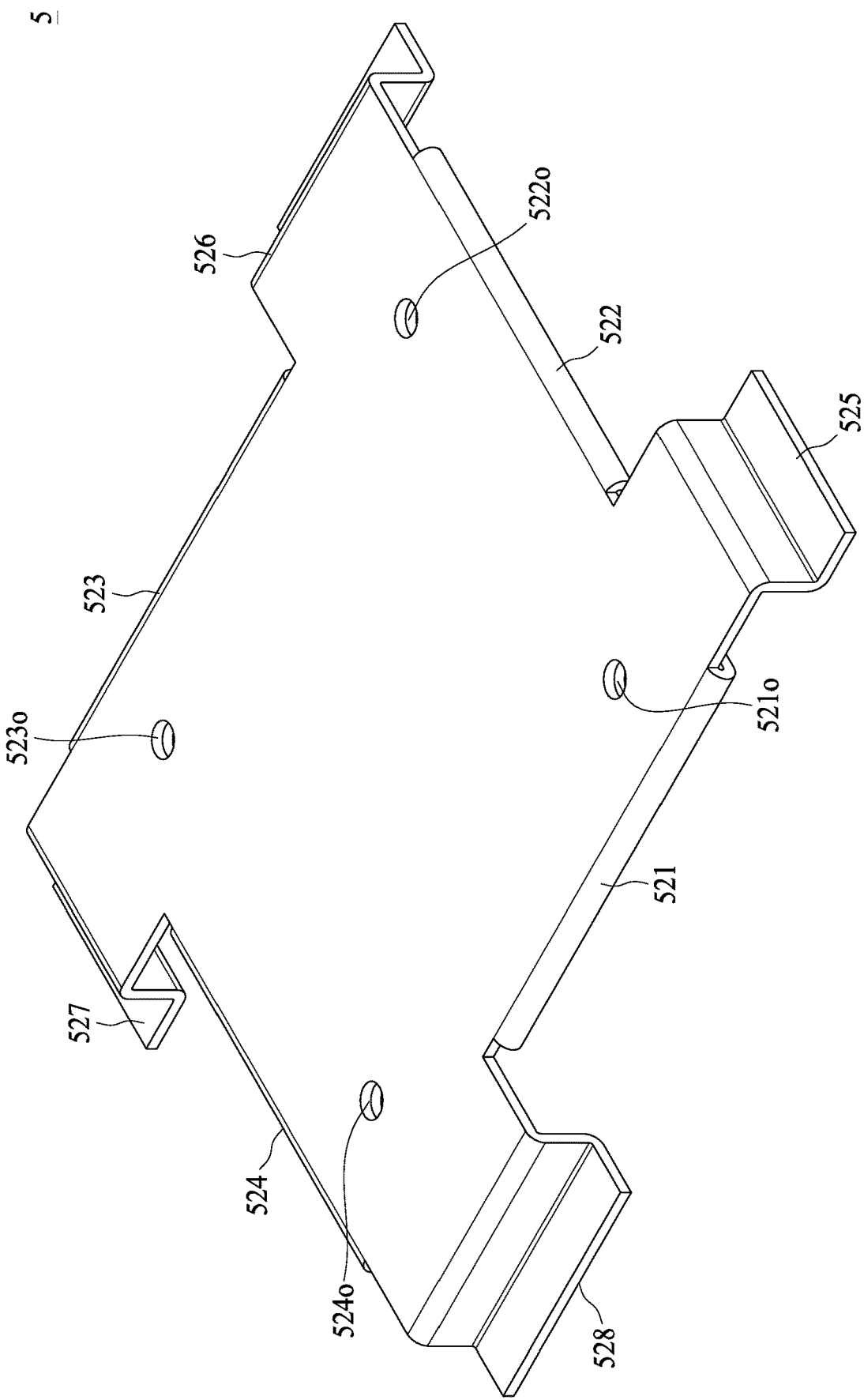
FIG. 5 illustrates a stereoscopic diagram of a conductive lid according to some embodiments of the present disclosure.

FIG. 5 illustrates a stereoscopic diagram of a conductive lid 5 according to some embodiments of the present disclosure. Specifically, the conductive lid 5 comprises portions 521, 522, 523 and 524 which form a first type of heat dissipation contact portions. The conductive lid 5 further comprises stepped portions 525, 526, 527 and 528 which form a second type of heat dissipation contact portions. As shown in FIG. 5, the first type of heat dissipation contact portions are arranged adjacent to the second type of heat dissipation contact portions. The first type of heat dissipation contact portions and the second type of heat dissipation contact portions are alternately arranged around four sides of the body of the conductive lid 5. The conductive lid 5 further comprises four holes 521*o*, 522*o*, 523*o* and 524*o* on the portions 521, 522, 523, and 524, respectively. The holes 521*o*, 522*o*, 523*o* and 524*o* are used for accommodating locking accessories (such as push pins, screws, DIP pins, card hoods, and so on).

Figure 6A:
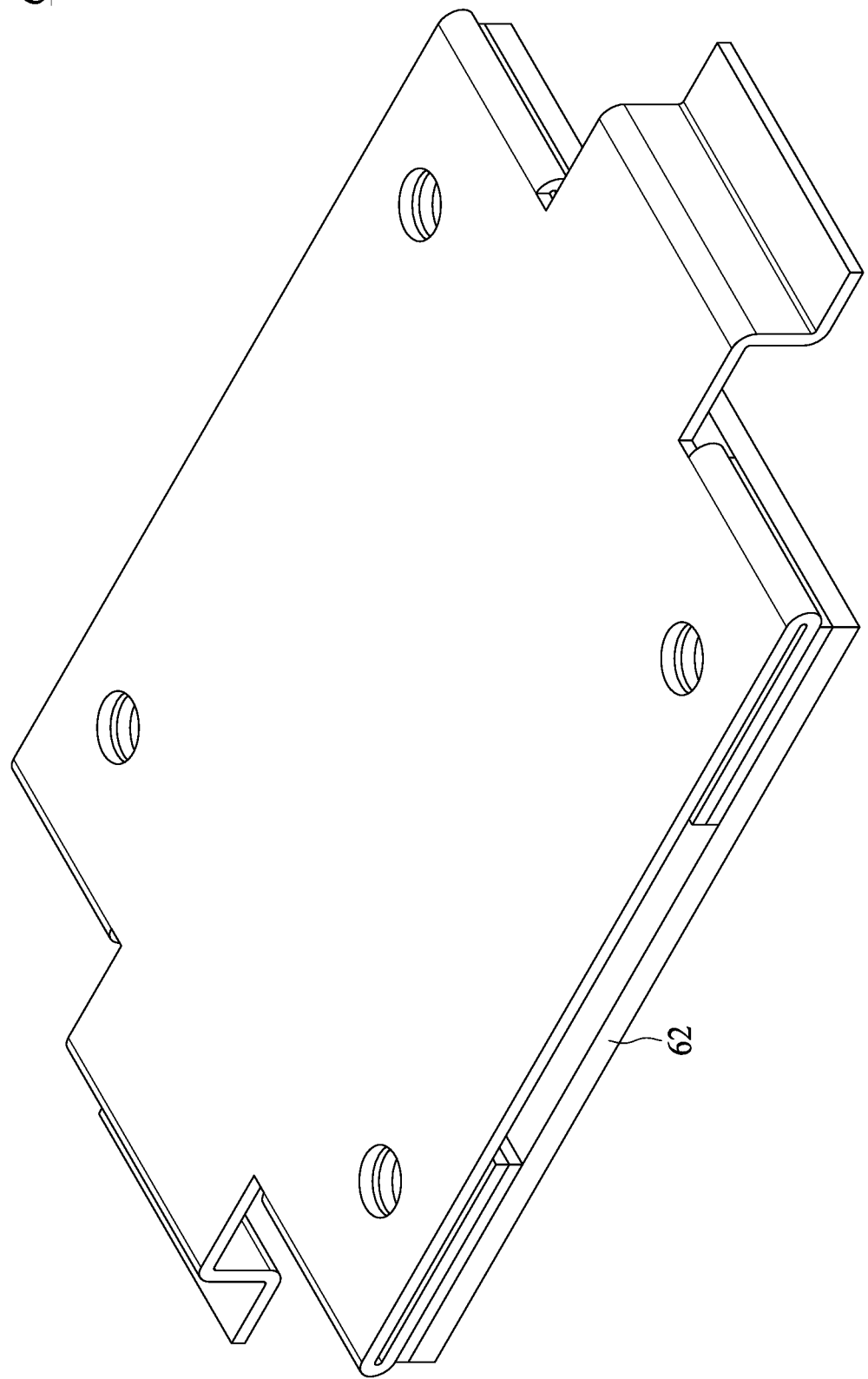
FIG. 6A illustrates a stereoscopic diagram of a semiconductor device package according to some embodiments of the present disclosure.
Figure 6B:
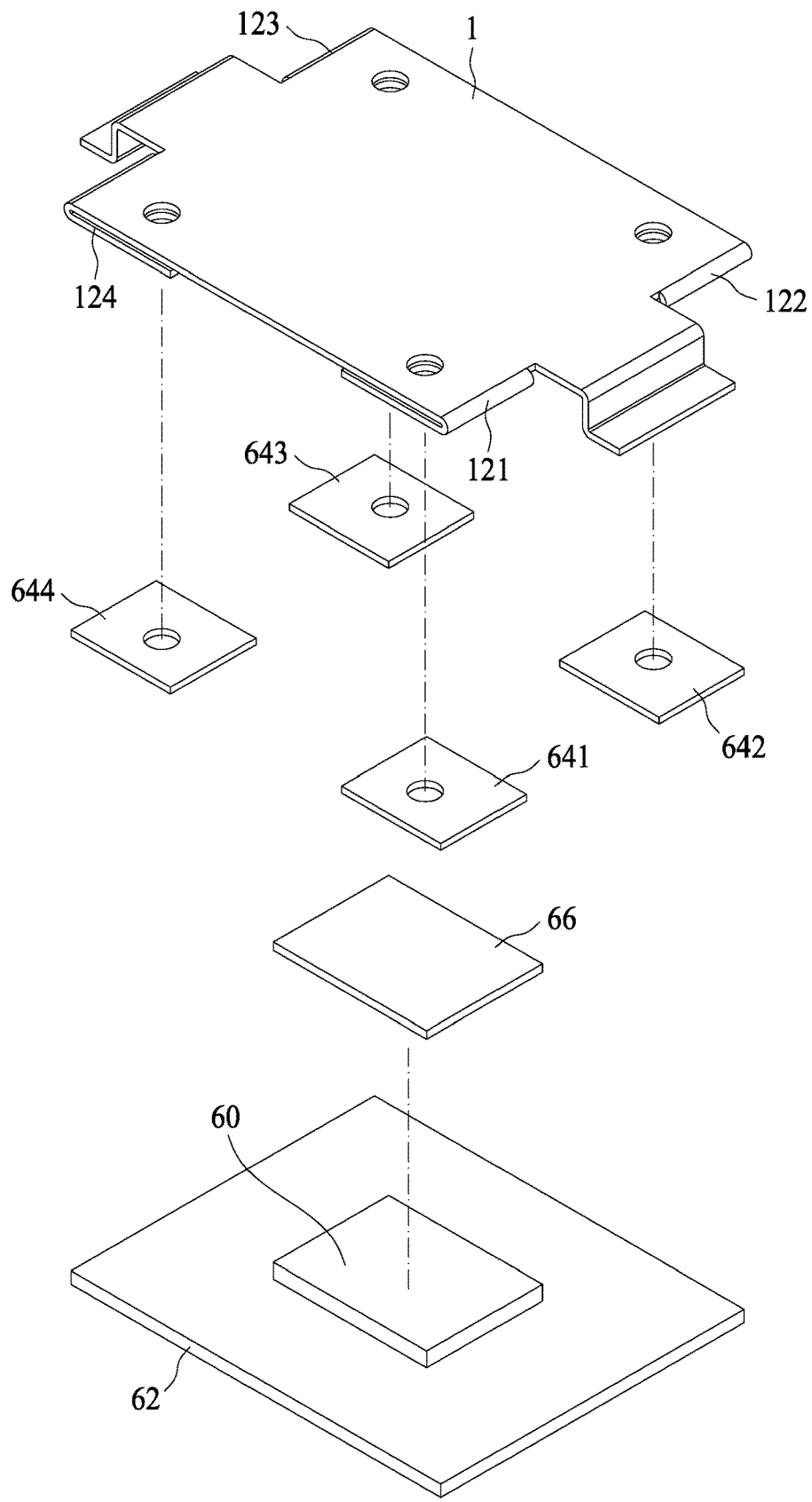
FIG. 6B is an exploded perspective view of the semiconductor device package in FIG. 6A.

FIG. 6A illustrates a stereoscopic diagram of a semiconductor device package 6 according to some embodiments of the present disclosure. FIG. 6B is an exploded perspective view of the semiconductor device package 6 in FIG. 6A. Referring to FIGS. 6A and 6B, the semiconductor device package 6 comprises a semiconductor component 60, a substrate 62, and a conductive lid 1. Please note that the conductive lid 1 in FIGS. 6A and 6B is the same as the conductive lid 1 in FIG. 1, and thus details of the structure of the conductive lid 1 are not repeated here. The semiconductor component 60 can be, for example, a die. The semiconductor component 60 is disposed over the substrate 62. The conductive lid 1 is disposed over the semiconductor component 60 and the substrate 62. As shown in FIG. 6B, the semiconductor device package 6 further comprises a thermal interface material (TIM) 66 and adhesive tapes 641, 642, 643 and 644. The TIM 66 is disposed between the conductive lid 1 and the semiconductor component 60. The adhesive tape 641 has a hole and is disposed between the bottom surface of the portion 121 of the conductive lid 1 and the substrate 62. The adhesive tape 642 has a hole and is disposed between the bottom surface of the portion 122 of the conductive lid 1 and the substrate 62. The adhesive tape 643 has a hole and is disposed between the bottom surface of the portion 123 of the conductive lid 1 and the substrate 62. The adhesive tape 644 has a hole and is disposed between the bottom surface of the portion 124 of the conductive lid 1 and the substrate 62.

Figure 7A:
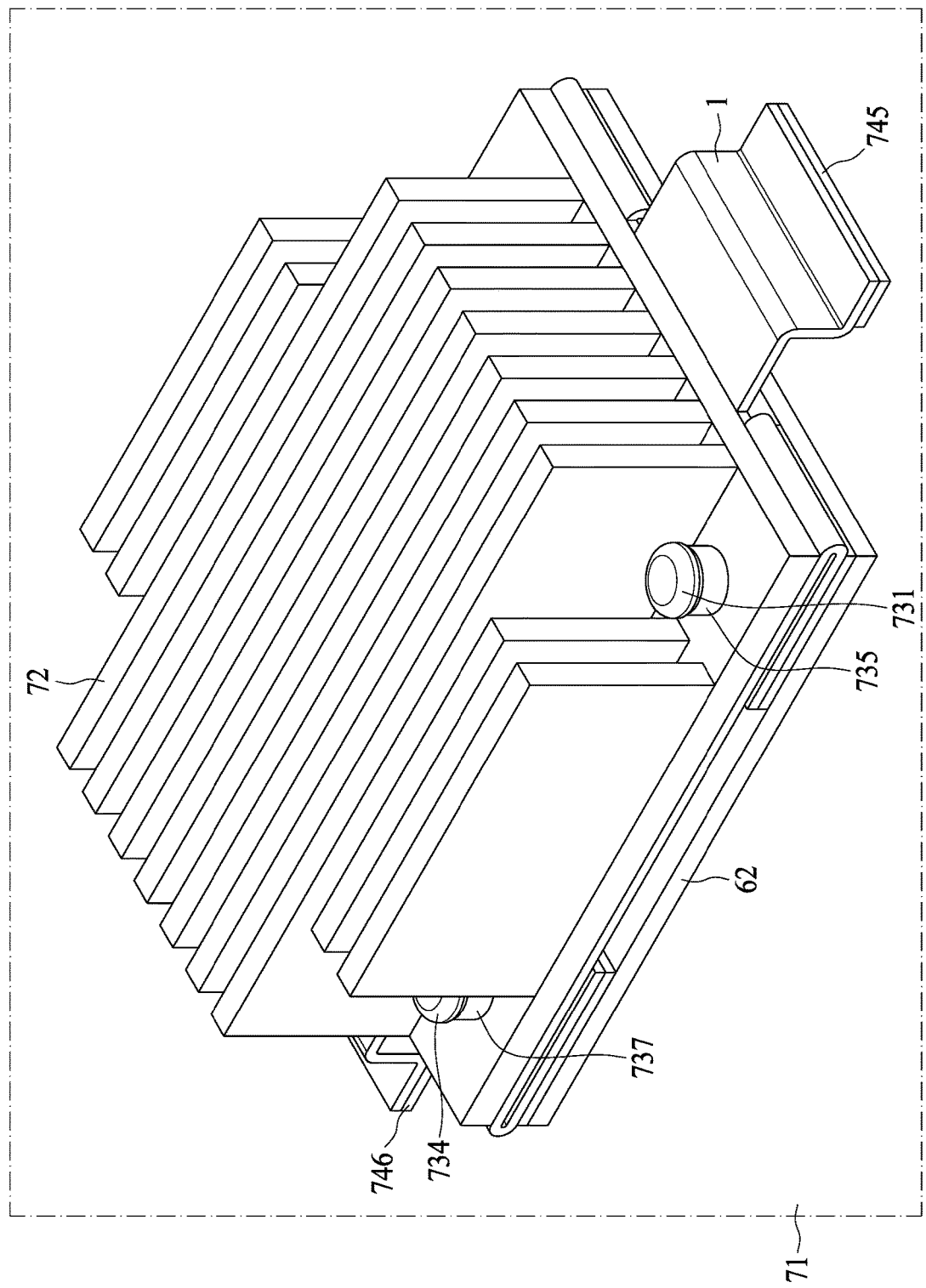
FIG. 7A illustrates a stereoscopic diagram of a semiconductor device package according to some embodiments of the present disclosure.
Figure 7B:
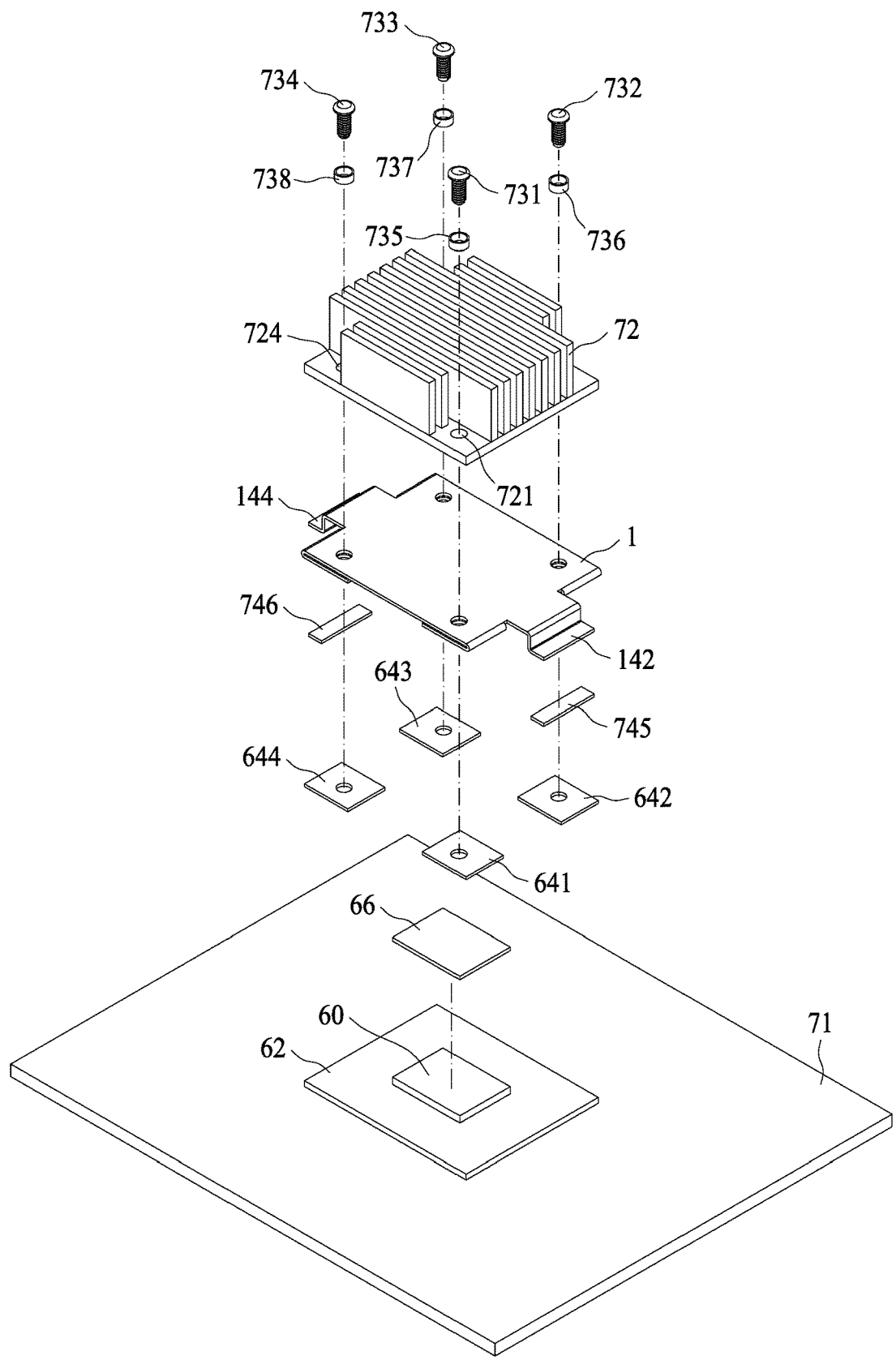
FIG. 7B is an exploded perspective view of the semiconductor device package in FIG. 7A.

FIG. 7A illustrates a stereoscopic diagram of a semiconductor device package 7 according to some embodiments of the present disclosure. FIG. 7B is an exploded perspective view of the semiconductor device package 7 in FIG. 7A. Referring to FIGS. 7A and 7B, the semiconductor device package 7 comprises a semiconductor component 60, a substrate 62, and a conductive lid 1. Please note that the conductive lid 1 in FIGS. 7A and 7B is the same as the conductive lid 1 in FIG. 1, and thus details of the structure of the conductive lid 1 are not repeated here. The semiconductor component 60 can be, for example, a die. The semiconductor component 60 is disposed over the substrate 62. The conductive lid 1 is disposed over the semiconductor component 60 and the substrate 62. As shown in FIG. 7B, the semiconductor device package 6 comprises a TIM 66 and adhesive tapes 641, 642, 643 and 644. The TIM 66 is disposed between the conductive lid 1 and the semiconductor component 60. The adhesive tape 641 has a hole and is disposed between the bottom surface of the portion 121 of the conductive lid 1 and the substrate 62. The adhesive tape 642 has a hole and is disposed between the bottom surface of the portion 122 of the conductive lid 1 and the substrate 62. The adhesive tape 643 has a hole and is disposed between the bottom surface of the portion 123 of the conductive lid 1 and the substrate 62. The adhesive tape 644 has a hole and is disposed between the bottom surface of the portion 124 of the conductive lid 1 and the substrate 62. The heat generated by the semiconductor component 60 can be conducted to the substrate 62 via the portions 121, 122, 123 and 124

The difference between the semiconductor device package 7 in FIGS. 7A and 7B and the semiconductor device package 6 in FIGS. 6A and 6B is that the semiconductor device package 7 further comprises a substrate 71, a heat spreader 72, push pins 731, 732, 733 and 734, springs 735, 736, 737 and 738 and adhesive tapes 745 and 746. Specifically, the substrate 71 is disposed under the substrate 62. In some embodiments, the substrate 62 can be, for example, a ball grid array (BGA) substrate, and the substrate 71 can be, for example, a printed circuit board (PCB). The adhesive tapes 745 and 746 are disposed between the bottom surface of the portions 142 and 144 of the conductive lid 1 and the substrate 71 such that the conductive lid 1 can be fixed to the substrate 71. In this embodiment, the heat generated by the semiconductor component 60 can be simultaneously conducted to the substrate 62 and the substrate 71. The heat spreader 72 is disposed on the conductive lid 1. The heat spreader 72 further comprises holes 721, 722, 723 and 724 at four corners. In this embodiment, because the conductive lid 1 has holes 121o, 122o, 123o and 124o reserved, the heat spreader 72 can be fixed to the conductive lid 1 using the push pins 731, 732, 733 and 734 and the springs 735, 736, 737 and 738.

Figure 8A:
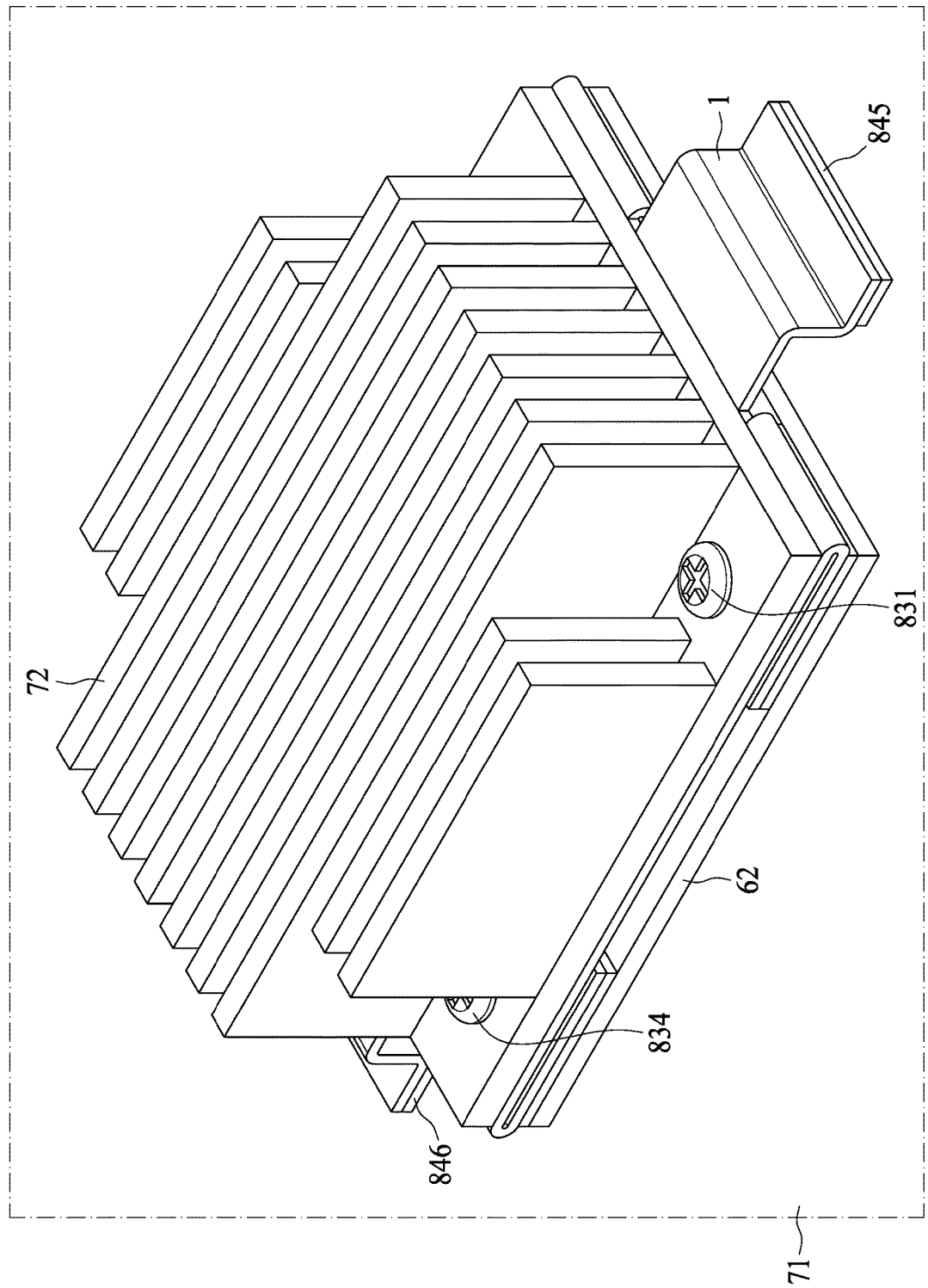
FIG. 8A illustrates a stereoscopic diagram of a semiconductor device package according to some embodiments of the present disclosure.
Figure 8B:
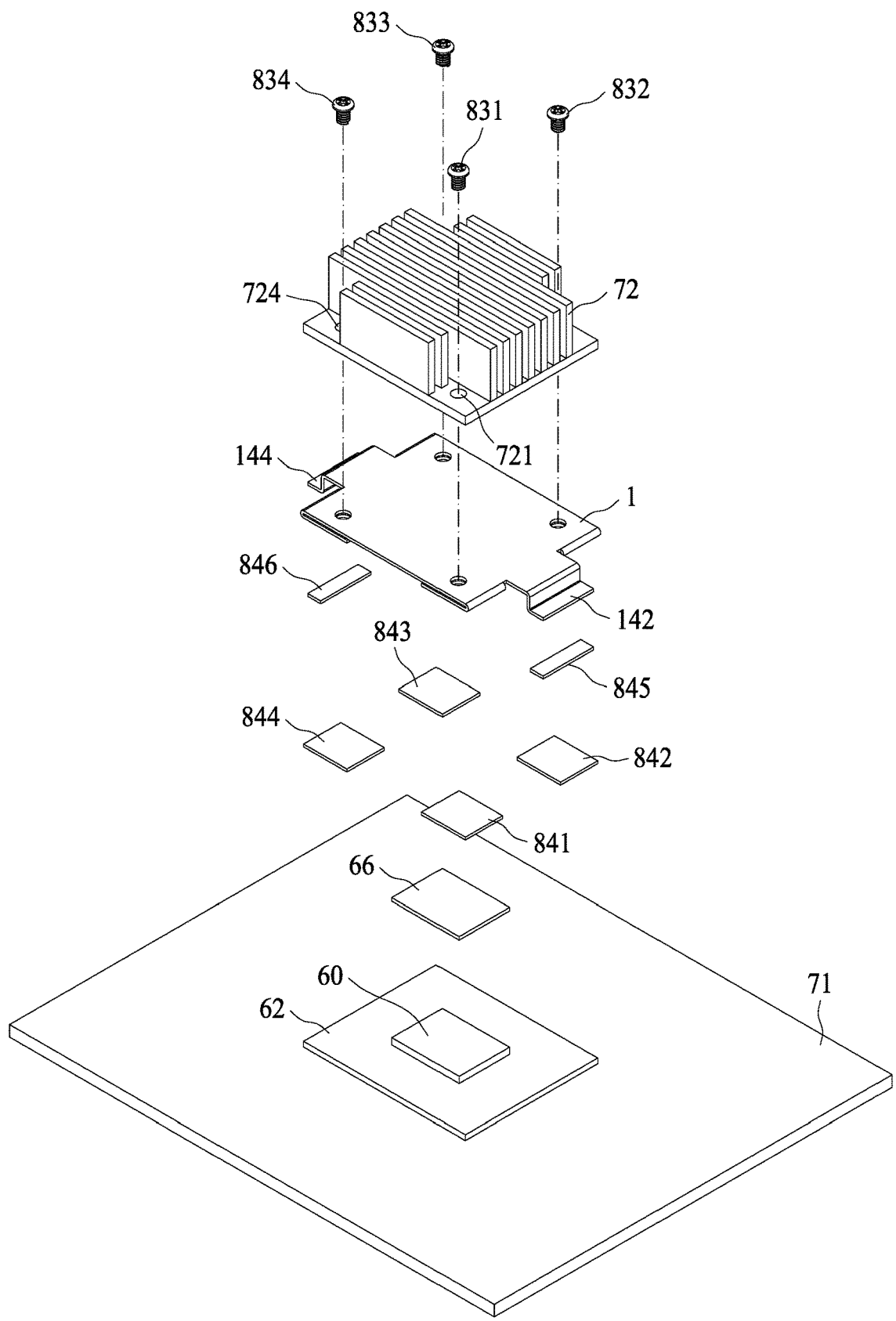
FIG. 8B is an exploded perspective view of the semiconductor device package in FIG. 8A.

FIG. 8A illustrates a stereoscopic diagram of a semiconductor device package 8 according to some embodiments of the present disclosure. FIG. 8B is an exploded perspective view of the semiconductor device package 8 in FIG. 8A. The semiconductor device package 8 in FIGS. 8A and 8B is similar to the semiconductor device package 7 in FIGS. 7A and 7B. The differences between the semiconductor device package 8 and semiconductor device package 7 are that the locking accessories in FIGS. 8A and 8B are screws 831, 832, 833 and 834 instead of push pins and springs and that the adhesive tapes 841, 842, 843 and 844 do not have a hole. In this embodiment, because the conductive lid 1 has holes 121o1, 122o1, 123o1 and 124o1 reserved, the heat spreader 72 can be fixed to the conductive lid 1 using the screws 831, 832, 833 and 834.

Figure 9A:
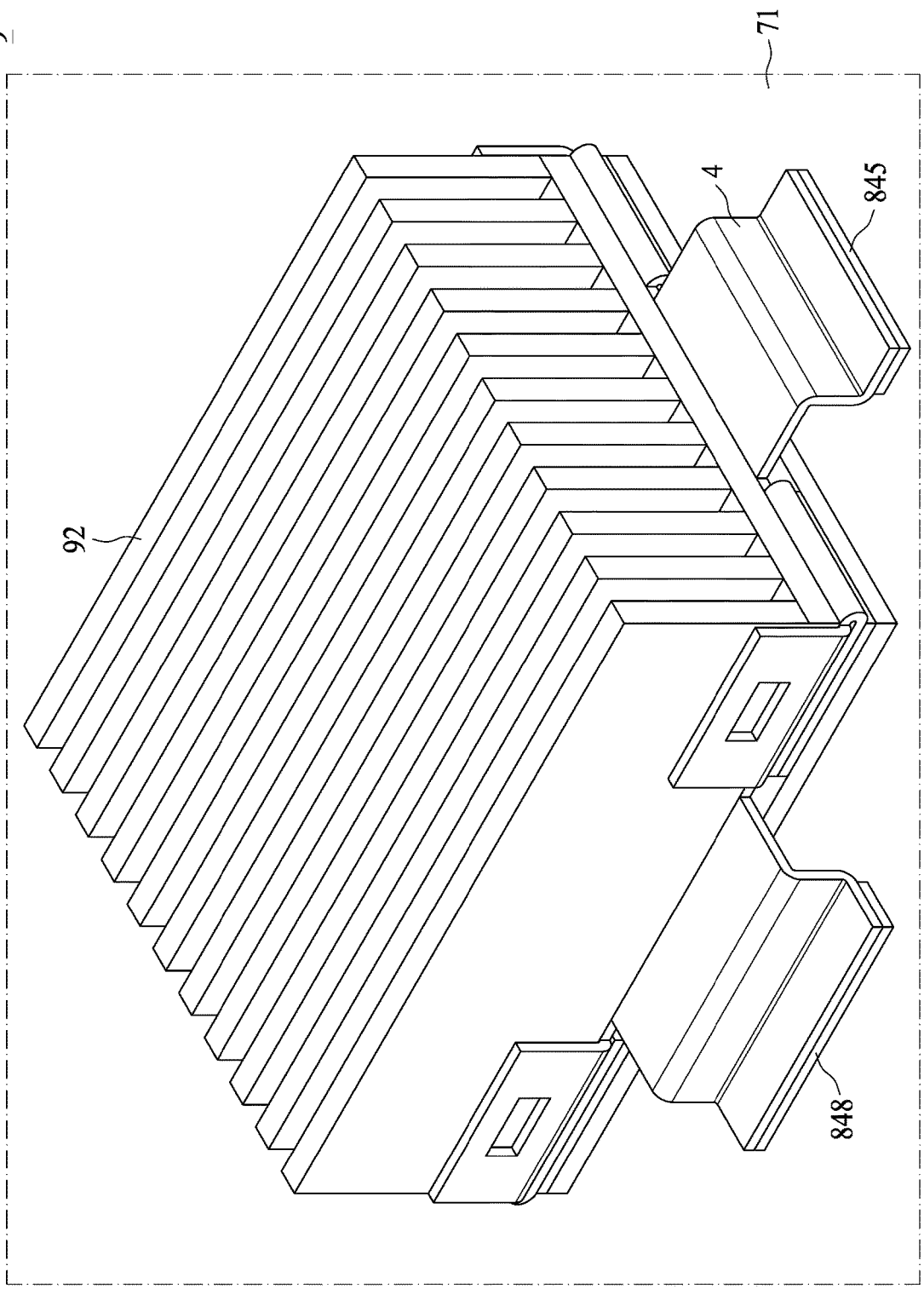
FIG. 9A illustrates a stereoscopic diagram of a semiconductor device package according to some embodiments of the present disclosure.
Figure 9B:
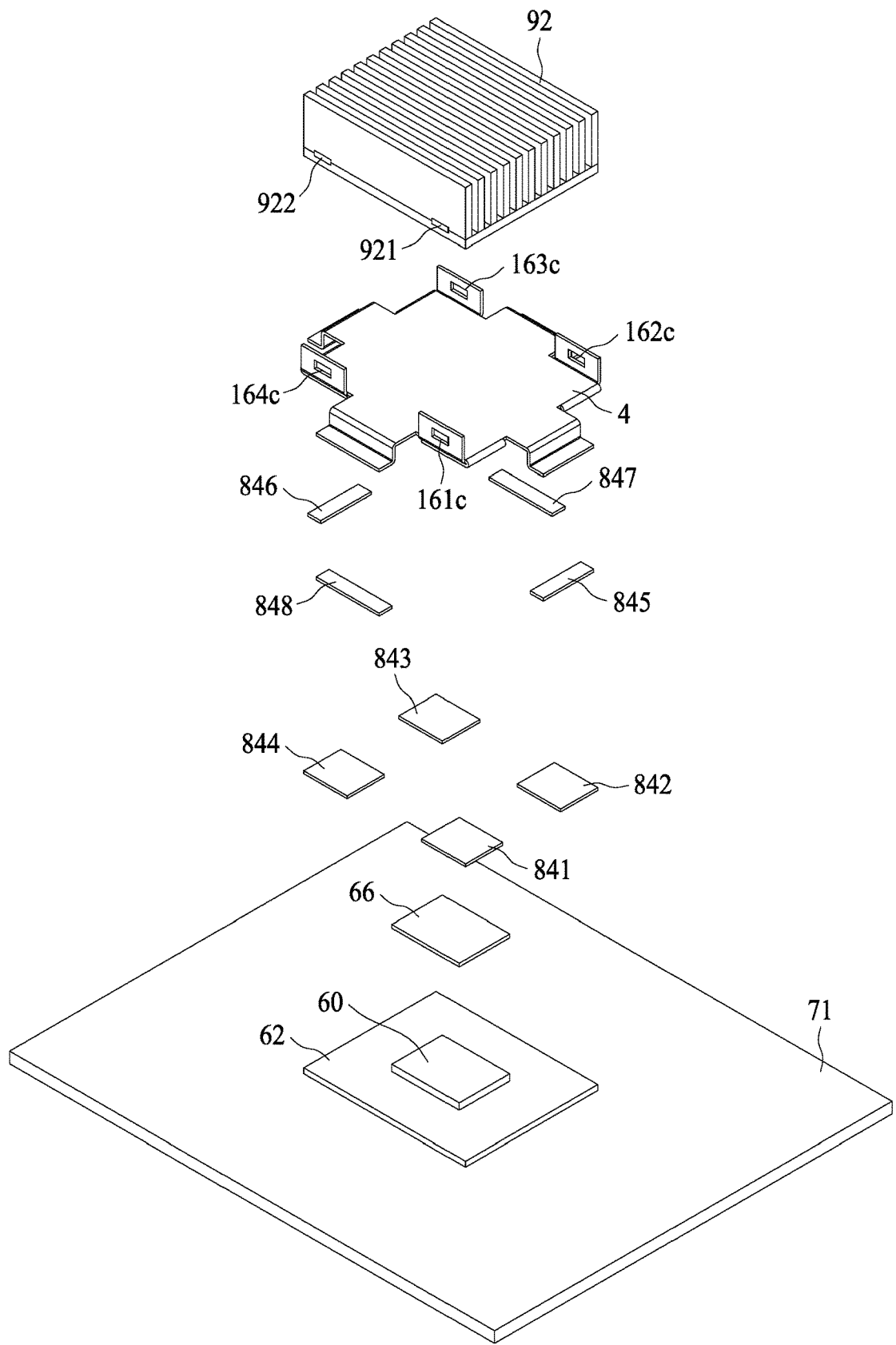
FIG. 9B is an exploded perspective view of the semiconductor device package in FIG. 9A.

FIG. 9A illustrates a stereoscopic diagram of a semiconductor device package 9 according to some embodiments of the present disclosure. FIG. 9B is an exploded perspective view of the semiconductor device package 9 in FIG. 9A. As shown in FIGS. 9A and 9B, the semiconductor device package 9 comprises a semiconductor component 60, a substrate 62, a substrate 71, a conductive lid 4 and a heat spreader 92. Please note that the conductive lid 4 in FIGS. 9A and 9B is the same as the conductive lid 4 in FIG. 4, and thus details of the structure of the conductive lid 4 are not repeated here. In this embodiment, the semiconductor device package 9 comprises eight adhesive tapes 841, 842, 843, 844, 845, 846, 847 and 848. The adhesive tapes 841, 842, 843 and 844 are disposed between the conductive lid 4 and the substrate 62 such that the conductive lid 4 can be fixed to the substrate 62. The adhesive tapes 845, 846, 847 and 848 are disposed between the conductive lid 4 and the substrate 71 such that the conductive lid 4 can be fixed to the substrate 71. In this embodiment, the heat spreader 92 can be fixed to the conductive lid 4 using the card hook structures 161c, 162c, 163c, 164c of the holders 161, 162, 163 and 164 of the conductive lid 4.

Figure 10A:
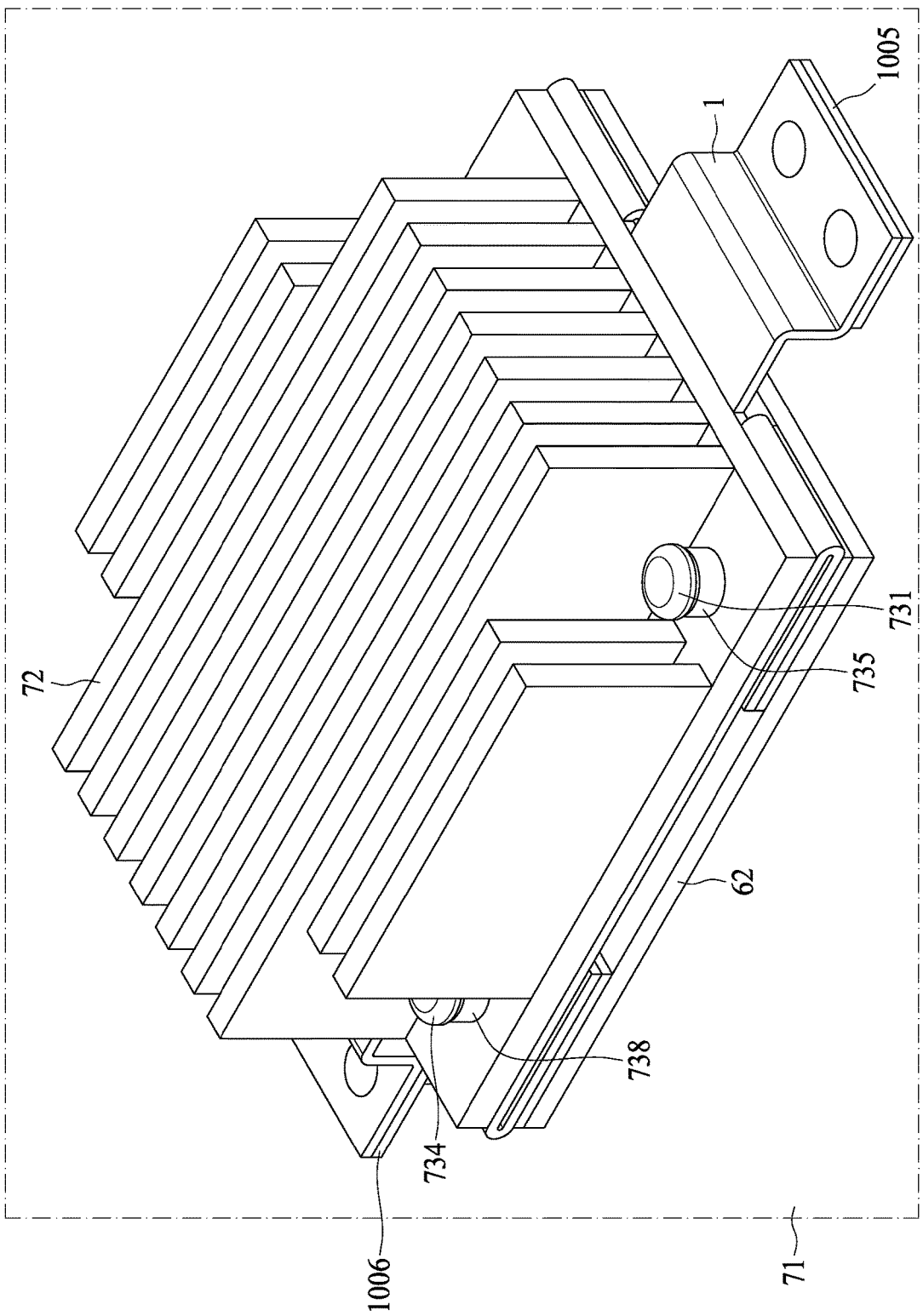
FIG. 10A illustrates a stereoscopic diagram of a semiconductor device package according to some embodiments of the present disclosure.
Figure 10B:
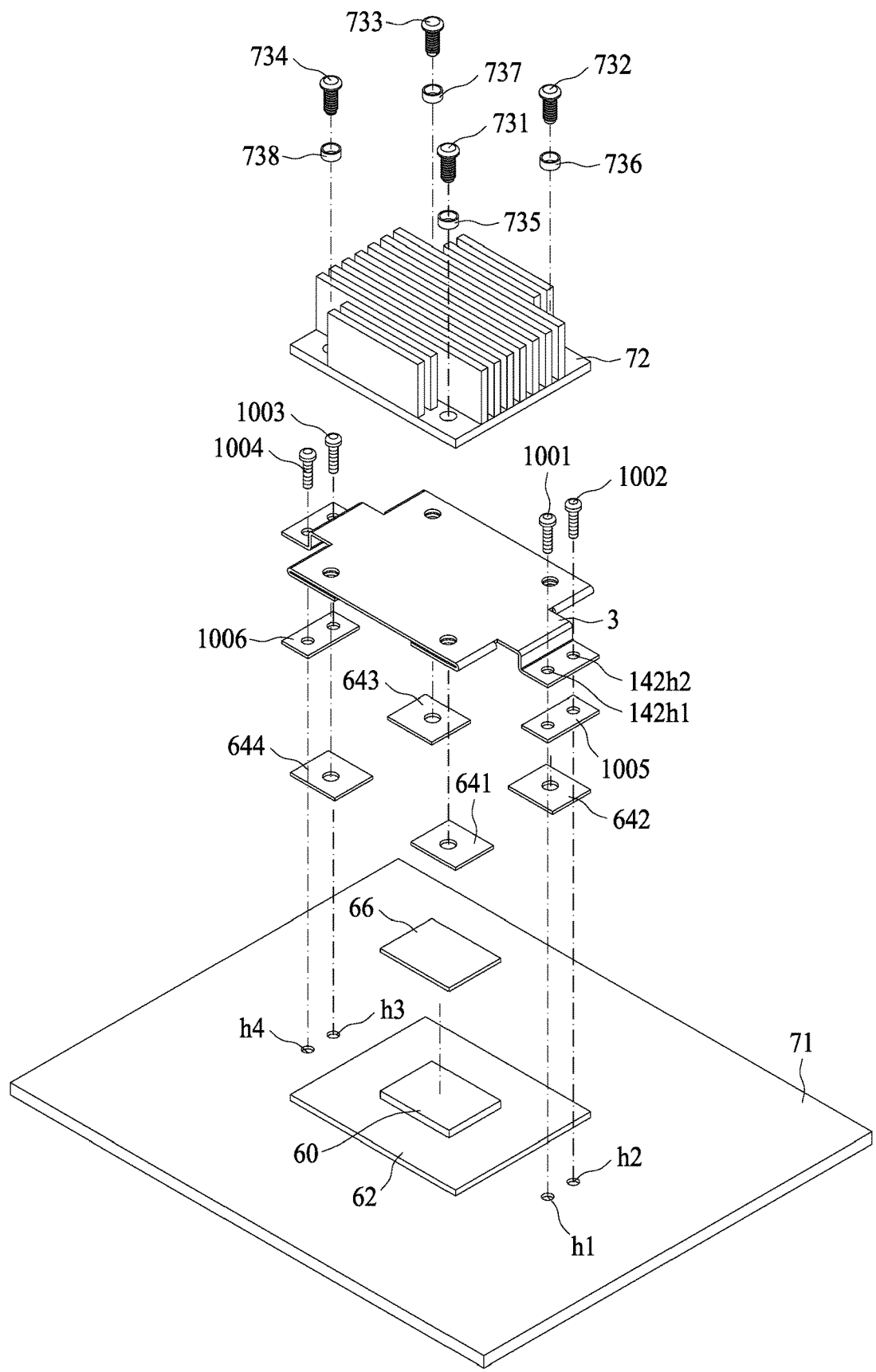
FIG. 10B is an exploded perspective view of the semiconductor device package in FIG. 10A.

FIG. 10A illustrates a stereoscopic diagram of a semiconductor device package 10' according to some embodiments of the present disclosure. FIG. 10B is an exploded perspective view of the semiconductor device package 10' in FIG. 10A. Referring to FIGS. 10A and 10B, the semiconductor device package 10' comprises a semiconductor component 60, a substrate 62, adhesive tapes 641, 642, 643, 644, a TIM 66, a conductive lid 3, a substrate 71, a heat spreader 72, push pins 731, 732, 733 and 734, springs 735, 736, 737 and 738 and adhesive tapes 745. In this embodiment, the semiconductor device package 10' further comprises DIP pins 1001, 1002, 1003 and 1004 and thermal greases 1005 and 1006. Please note that the semiconductor device package 10' in FIGS. 10A and 10B is similar to the semiconductor device package 7 in FIGS. 7A and 7B. The differences between the semiconductor device package 10' and the semiconductor device package 7 are that the conductive lid 3 of the semiconductor device package 10' further comprises holes 142h1, 142h2, 144h1 and 144h2 and that there are reserved holes h1, h2, h3 and h4 on the substrate 71 such that the conductive lid 3 can be fixed to the substrate 71 using DIP pins 1001, 1002, 1003 and 1004. In some embodiments, the semiconductor device package 10' can further comprise two sheets of thermal grease 1005 and 1006 which are disposed between the conductive lid 3 and the substrate 71 to increase the contact area between the conductive lid 3 and the substrate 71 such that the heat dissipation effect is increased.

Figure 11A:
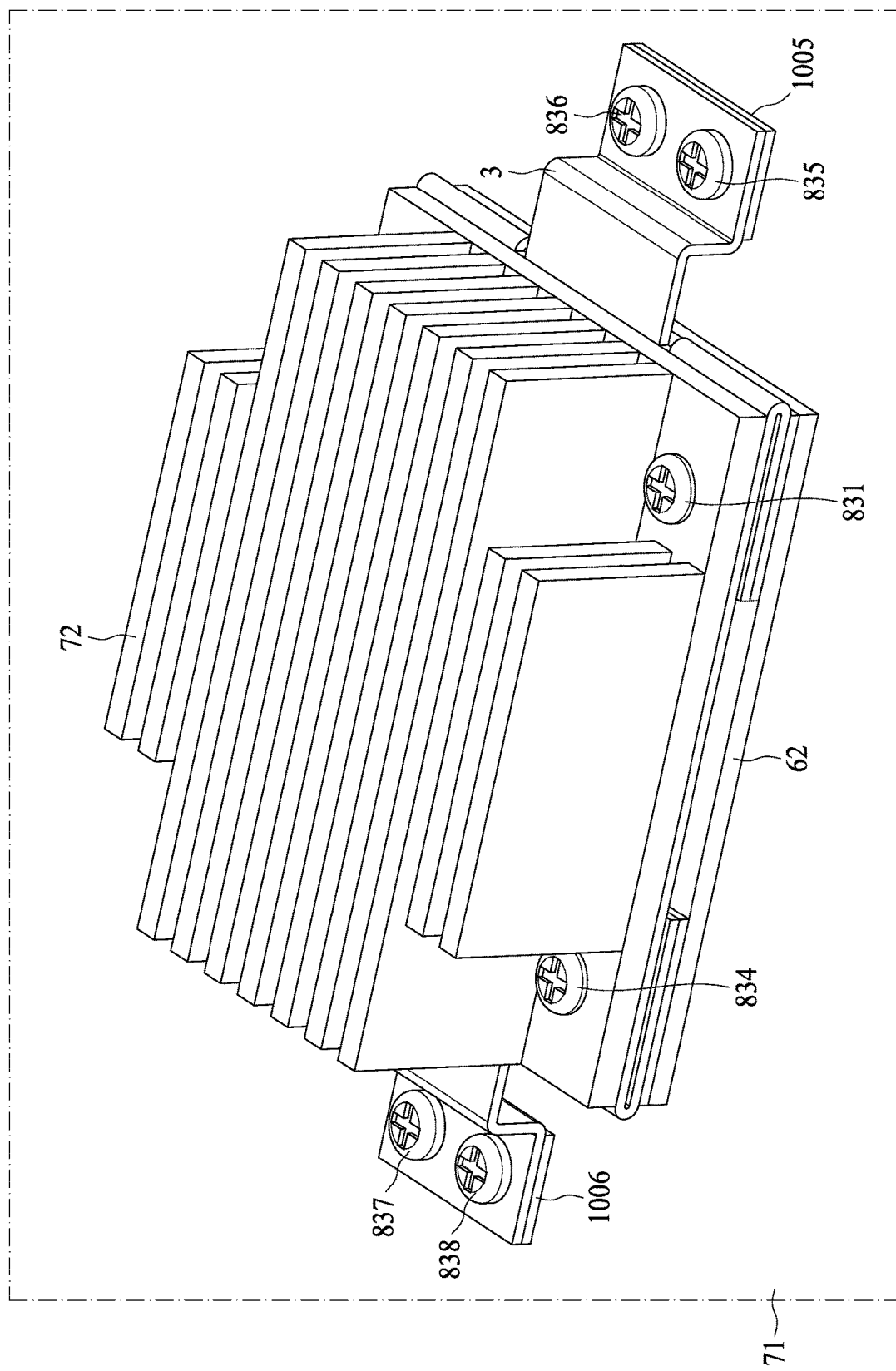
FIG. 11A illustrates a stereoscopic diagram of a semiconductor device package according to some embodiments of the present disclosure.
Figure 11B:
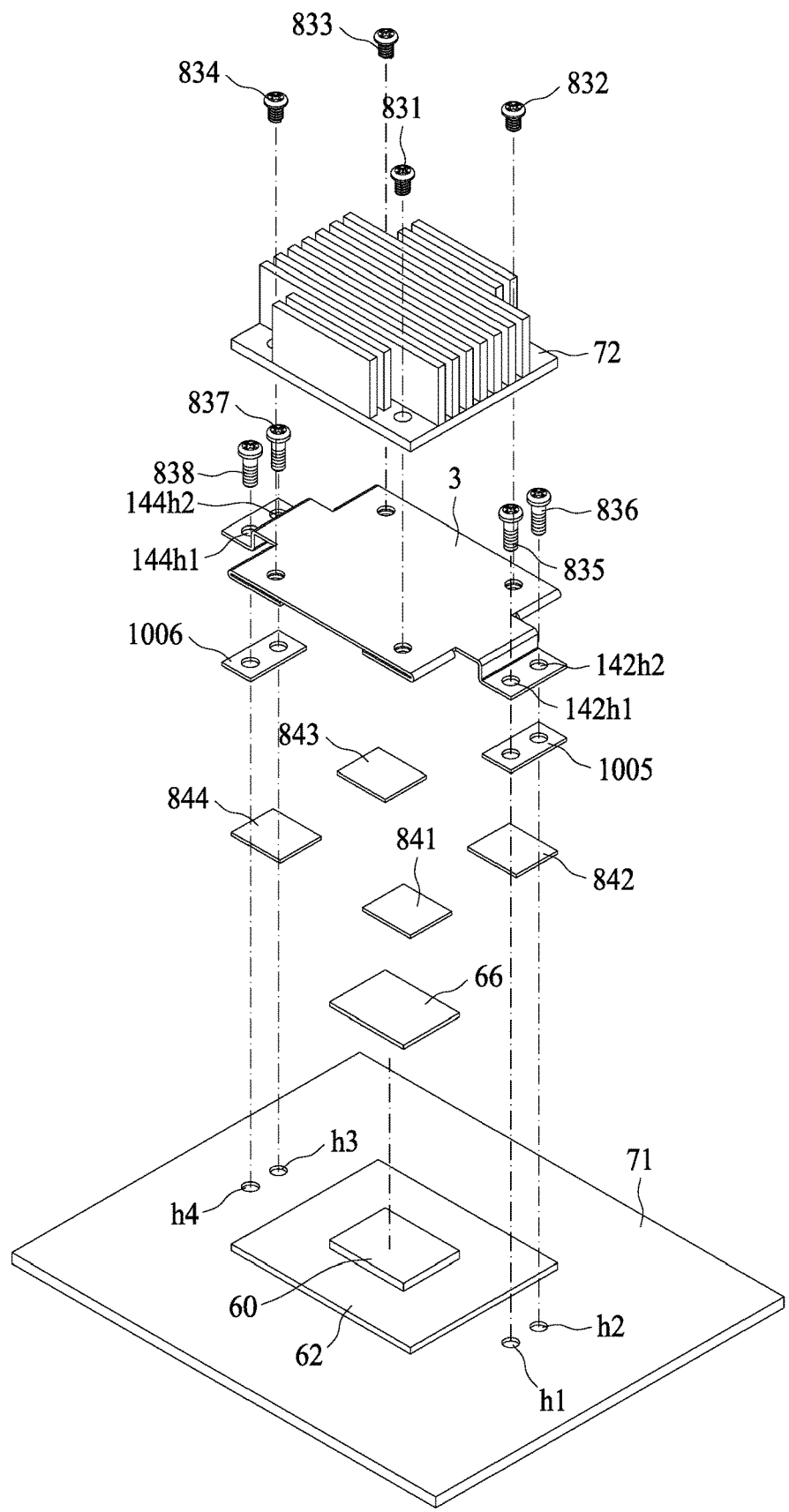
FIG. 11B is an exploded perspective view of the semiconductor device package in FIG. 11A.

FIG. 11A illustrates a stereoscopic diagram of a semiconductor device package 11 according to some embodiments of the present disclosure. FIG. 11B is an exploded perspective view of the semiconductor device package 11 in FIG. 11A. Referring to FIGS. 11A and 11B, the semiconductor device package 11 comprises a semiconductor component 60, a substrate 62, adhesive tapes 841, 842, 843, 844, a TIM 66, a conductive lid 3, a substrate 71, a heat spreader 72, screws 831 to 838, and adhesive tapes 1005 and 1006. The semiconductor device package 11 in FIGS. 11A and 11B is similar to the semiconductor device package 10' in FIGS. 10A and 10B. The difference between the semiconductor device package 11 and the semiconductor device package 10' is that the locking accessories in FIGS. 11A and 11B are screws instead of push pins and springs. Thus, the heat spreader 72 can be fixed to the conductive lid 3 using the screws 831, 832, 833 and 834. Additionally, due to the reserved holes 142h1, 142h2, 144h1 and 144h2 on the conductive lid 3 and the reserved holes h1, h2, h3 and h4 on the substrate 71, the conductive lid 3 can be fixed to the substrate 71 using the screws 835, 836, 837 and 838 and nuts (not shown) on the bottom surface of the substrate 71. Please note that in this embodiment, the diameter of the reserved holes h1, h2, h3 and h4 on the substrate 71 is around 3.0 mm to 3.5 mm. In comparative structures, due to the lack of the conductive lid of the present disclosure, the diameter of the reserved holes on a substrate (e.g., PCB) is around 5.0 mm to 6.0 mm. A comparative structure has larger reserved holes, thereby reducing the usable space of the substrate (e.g., PCB).

Figure 12A:
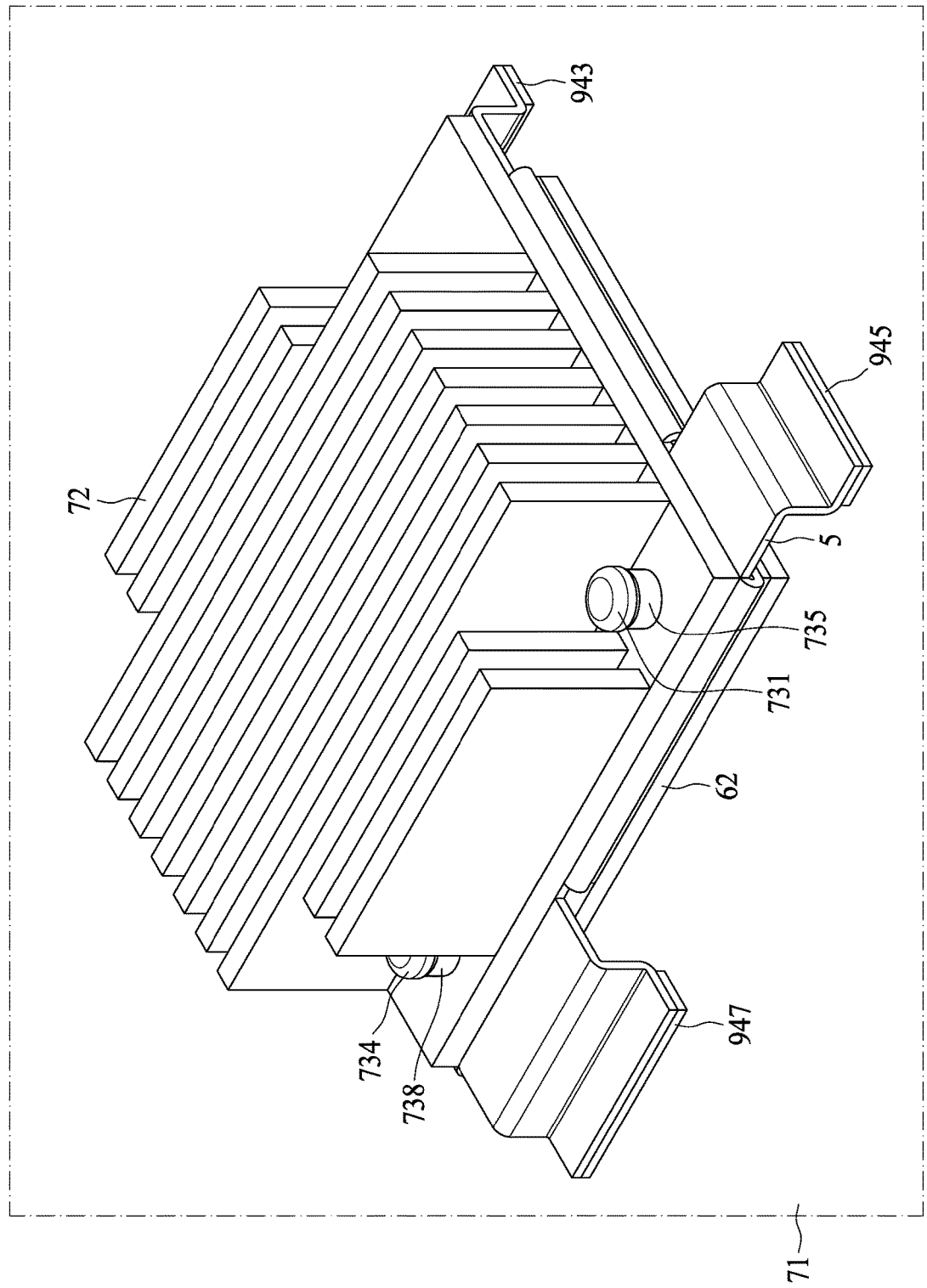
FIG. 12A illustrates a stereoscopic diagram of a semiconductor device package according to some embodiments of the present disclosure.
Figure 12B:
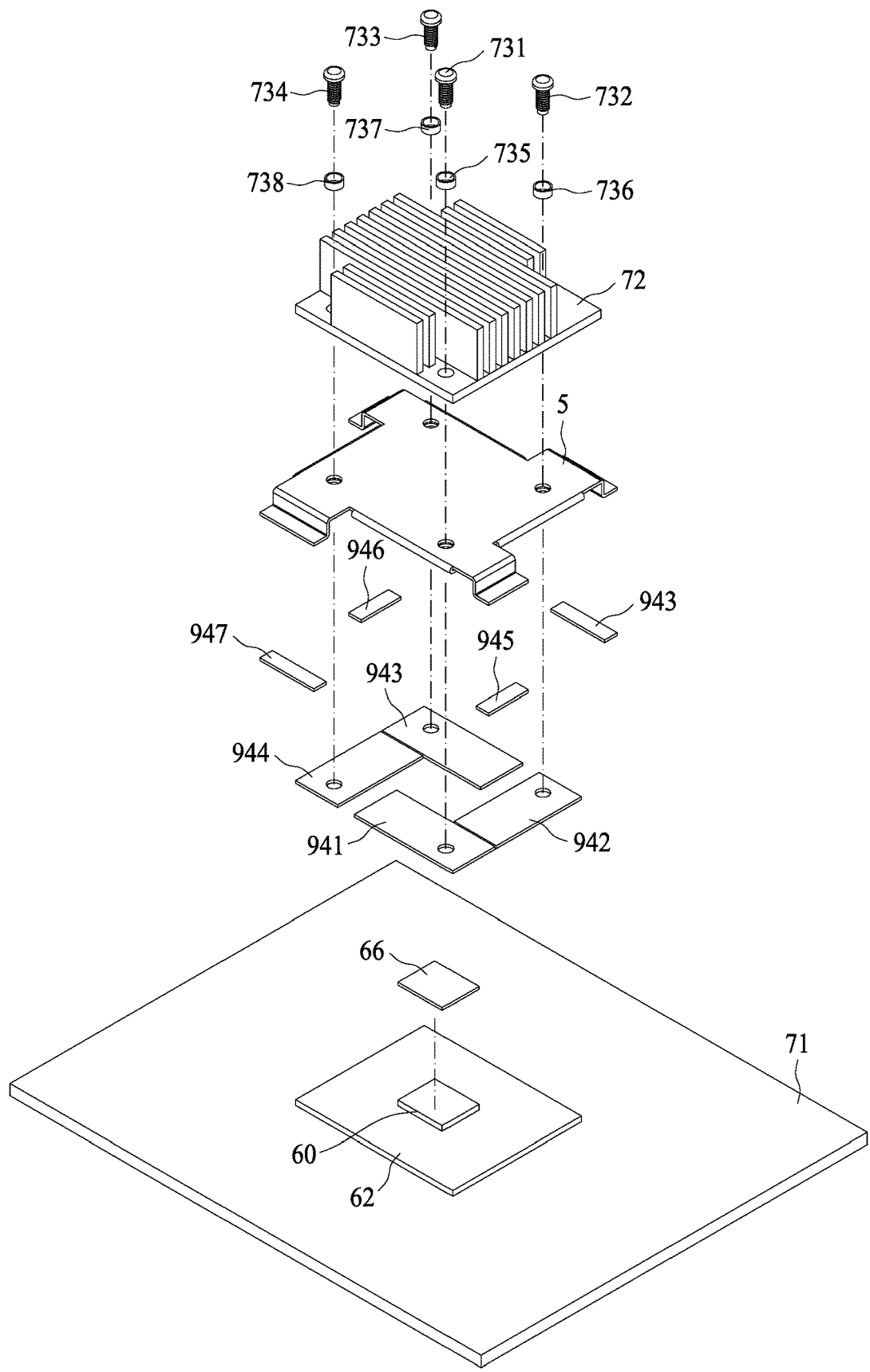
FIG. 12B is an exploded perspective view of the semiconductor device package in FIG. 12A.

FIG. 12A illustrates a stereoscopic diagram of a semiconductor device package 12 according to some embodiments of the present disclosure. FIG. 12B is an exploded perspective view of the semiconductor device package 12 in FIG. 12A. Referring to FIGS. 12A and 12B, the semiconductor device package 12 comprises a semiconductor component 60, a substrate 62, a TIM 66, a conductive lid 5, a substrate 71, a heat spreader 72, push pins 731, 732, 733 and 734, and springs 735, 736, 737 and 738. The heat spreader 72 can be fixed to the conductive lid 5 using the push pins 731, 732, 733 and 734 and the springs 735, 736, 737 and 738. The semiconductor device package 12 further comprises adhesive tapes 941, 942, 943 and 944 which are disposed between the bottom surface of the portions 521, 522, 523 and 524 (e.g., the first type of heat dissipation contact portions) of the conductive lid 5 and the substrate 62 such that the conductive lid 5 can be fixed to the substrate 62 and that the heat generated by the semiconductor component 60 can be conducted to the substrate 62. The semiconductor device package 12 further comprises adhesive tapes 945, 946, 947 and 948 which are disposed between the bottom surface of the portions 525, 526, 527 and 528 (e.g., the second type of heat dissipation contact portions) of the conductive lid 5 and the substrate 71 such that the conductive lid 5 can be fixed to the substrate 71 and that the heat generated by the semiconductor component 60 can be conducted to the substrate 71.

Figure 13:
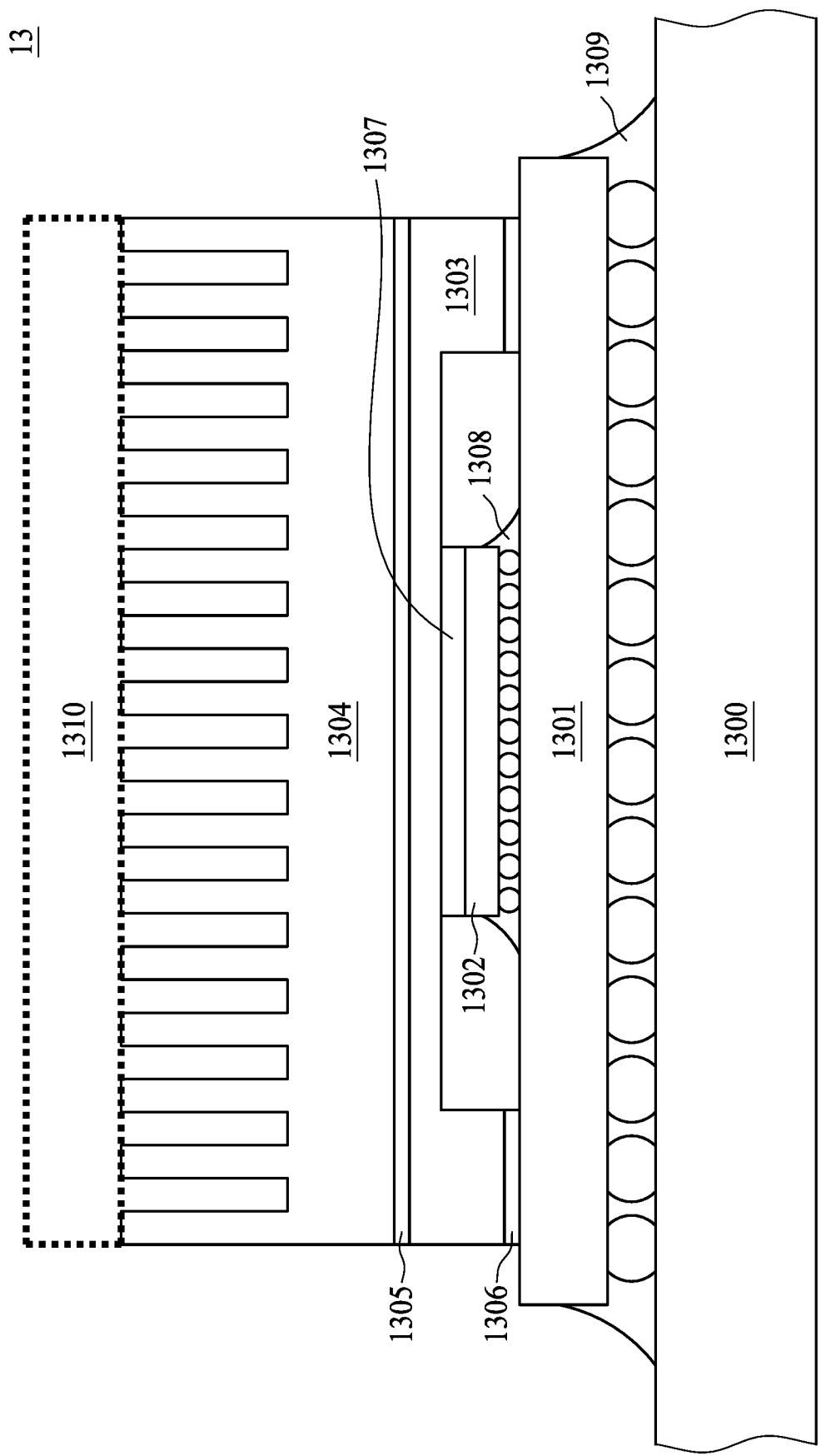
FIG. 13 illustrates a cross-sectional view of a semiconductor device package 13 according to another embodiment of the present disclosure.

FIG. 13 illustrates a cross-sectional view of a semiconductor device package 13 according to another embodiment of the present disclosure. As shown in FIG. 13, the semiconductor device package 13 comprises a PCB 1300, a BGA substrate 1301, a die 1302, a lid 1303, and a heat spreader 1304. The lid 1303 has a hat shape, which is different from the conductive lids 1, 3, 4 and 5 of the embodiments of the present disclosure. The semiconductor device package 13 can further comprise a TIM 1305 disposed between the lid 1303 and the heat spreader 1304 and another TIM 1307 disposed between the die 1302 and the lid 1303. The semiconductor device package 13 can further comprise adhesive 1306 disposed between the lid 1303 and the BGA substrate 1301. The semiconductor device package 13 can further comprise an underfill 1308 disposed between the BGA substrate 1301 and the die 1302 and another underfill 1309 disposed between the PCB 1300 and the BGA substrate 1301.

Figure 14:
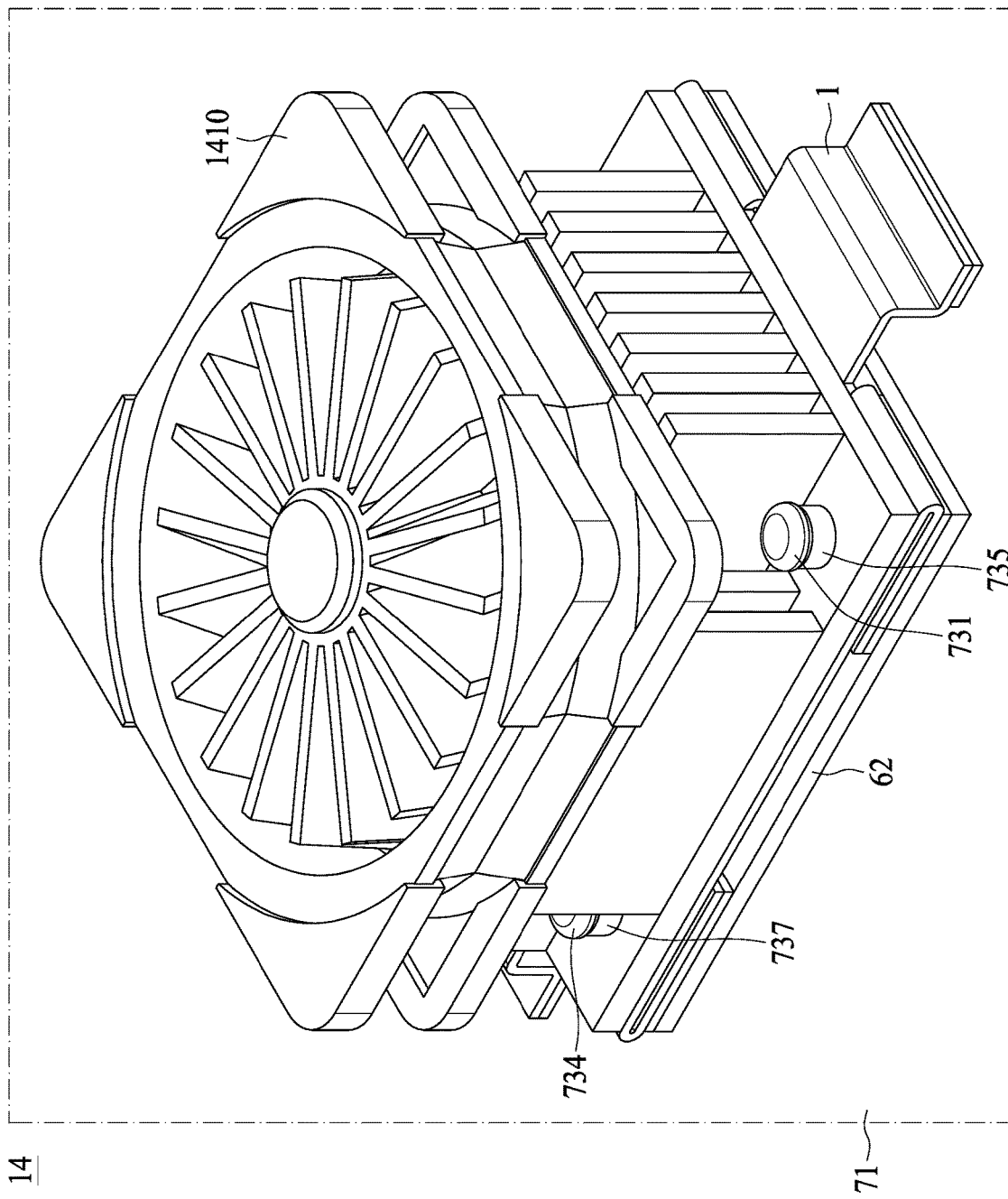
FIG. 14 illustrates a stereoscopic diagram of a semiconductor device package 14 according to some embodiments of the present disclosure.

FIG. 14 illustrates a stereoscopic diagram of a semiconductor device package 14 according to some embodiments of the present disclosure. The semiconductor device package 14 in FIG. 14 is similar to the semiconductor device package 7 in FIG. 7, and a difference between them is that the semiconductor device package 14 further comprises a fan 1410 disposed on the heat spreader 72. The fan 1410 can be fixed to the heat spreader 72 by thermal grease, adhesives or the like.

Below is a table comparing the heat dissipation effects between the semiconductor device package 13 in FIG. 13 (under the condition that the heat sink 1304 and the fan 1310 are removed) and the semiconductor device package 7 in FIG. 7 (under the condition that the heat sink 72 is removed). Please note that in this case, the material of the lid 1303 of the semiconductor device package 13 and that of the conductive lid 1 of the semiconductor device package 7 are copper (Cu). Table 1 shows that under the same condition, the junction temperature of the semiconductor device package 7 and the thermal characteristics $\theta_{JA}$, $\varphi_{JT}$, and $\theta_{JB}$ are all lower than those of the semiconductor device package 13, which means that the semiconductor device package 7 has a better heat dissipation effect than the semiconductor device package 13. Please note that the parameter $\theta_{JA}$ of the thermal characteristic is the ability for conducting thermal energy in the entire semiconductor device package; the parameter $\varphi_{JT}$ of the thermal characteristic is the ability for conducting thermal energy from the semiconductor component toward the upper portion of the semiconductor device package; the parameter $\theta_{JB}$ of the thermal characteristic is the ability for conducting thermal energy from the die toward the lower portion of the semiconductor device package.

TABLE 1

| | Air speed (m/s) | Volume of lid (mm³) | Temp$_{case}$ (° C.) | Temp$_{junction}$ (° C.) | $\theta_{JA}$ (° C./W) | $\varphi_{JT}$ (° C./W) | $\theta_{JB}$ (° C./W) |
|---|---|---|---|---|---|---|---|
| FIG. 13 with no heat sink or fan (Cu) | 0 | 155.516 | 100.30 | 101.52 | 13.53 | 0.45 | 4.40 |
| FIG. 7 without a heat sink (Cu) | 0 | 147.716 | 95.91 | 97.02 | 11.86 | 0.41 | 2.72 |
| Improvement | — | −7.8 | −4.39 | −4.50 | −1.67 | −0.04 | −1.68 |
| Improvement (%) | — | −5.02% | −12.45% | −12.33% | −12.33% | −8.76% | −38.25% |

Below is a table comparing the heat dissipation effects between the semiconductor device package 13 in FIG. 13 (under the condition that the heat sink 1304 and the fan 1310 are removed) and the semiconductor device package 7 in FIG. 7 (under the condition that the heat sink 72 is removed). Please note that in this case, the material of the lid 1303 of the semiconductor device package 13 is copper (Cu) and the material of the conductive lid 1 of the semiconductor device package 7 is aluminum (Al). Table 2 shows that even though the thermal conductivity of aluminum is worse than that of copper, the junction temperature of the semiconductor device package 7 and the thermal characteristics $\theta_{JA}$, $\varphi_{JT}$, and $\theta_{JB}$ are all lower than those of the semiconductor device package 13, which means that of the semiconductor device package 7 still has a better heat dissipation effect than the semiconductor device package 13.

TABLE 2

| | Air speed (m/s) | Volume of lid (mm³) | Temp$_{case}$ (° C.) | Temp$_{junction}$ (° C.) | $\theta_{JA}$ (° C./W) | $\varphi_{JT}$ (° C./W) | $\theta_{JB}$ (° C./W) |
|---|---|---|---|---|---|---|---|
| FIG. 13 with no heat sink or fan (Cu) | 0 | 155.516 | 100.30 | 101.52 | 13.53 | 0.45 | 4.40 |
| FIG. 7 without a heat sink (Al) | 0 | 147.716 | 98.96 | 100.07 | 12.99 | 0.41 | 3.93 |
| Improvement | — | −7.8 | −1.34 | −1.45 | −0.54 | −0.04 | −0.47 |
| Improvement (%) | — | −5.02% | −3.80% | −3.97% | −3.97% | −8.85% | −10.69% |

Below is a table comparing the heat dissipation effects between the semiconductor device package 13 in FIG. 13 and the semiconductor device package 14 in FIG. 14. Please note that in this case, the material of the lid 1303 of the semiconductor device package 13 and that of the conductive lid 1 of the semiconductor device package 7 are copper (Cu) and the air speed of the fan is 0 m/s. Table 3 shows that under the same condition, the junction temperature of the semiconductor device package 14 and the thermal characteristics $\theta_{JA}$, $\varphi_{JT}$, and $\theta_{JB}$ are all lower than those of the semiconductor device package 13, which means that the semiconductor device package 14 has a better heat dissipation effect than the semiconductor device package 13.

TABLE 3

| | Air speed (m/s) | Volume of lid (mm³) | Temp$_{case}$ (° C.) | Temp$_{junction}$ (° C.) | $\theta_{JA}$ (° C./W) | $\varphi_{JT}$ (° C./W) | $\theta_{JB}$ (° C./W) |
|---|---|---|---|---|---|---|---|
| FIG. 13 (Cu) | 0 | 155.516 | 93.40 | 94.85 | 11.06 | 0.54 | 3.28 |
| FIG. 14 (Cu) | 0 | 147.716 | 91.46 | 92.80 | 10.30 | 0.50 | 2.29 |
| Improvement | — | −7.8 | −1.94 | −2.05 | −0.76 | −0.04 | −0.99 |
| Improvement (A) | — | −5.02% | −6.84% | −6.86% | −1.41% | −0.06% | −1.60% |

Below is a table comparing the heat dissipation effects between the semiconductor device package 13 in FIG. 13 and the semiconductor device package 14 in FIG. 14. Please note that in this case, the material of the lid 1303 of the semiconductor device package 13 and that of the conductive lid 1 of the semiconductor device package 7 are copper (Cu) and the air speed of the fans 1401 and 1310 is 2 m/s. Table 4 shows that under the same condition, the junction temperature of the semiconductor device package 14 and the thermal characteristics $\theta_{JA}$, $\varphi_{JT}$, and $\theta_{JB}$ are all lower than those of the semiconductor device package 13, which means that the semiconductor device package 14 has a better dissipation effect than the semiconductor device package 13.

TABLE 4

| | Air speed (m/s) | Volume of lid (mm³) | Temp$_{case}$ (° C.) | Temp$_{junction}$ (° C.) | $\theta_{JA}$ (° C./W) | $\varphi_{JT}$ (° C./W) | $\theta_{JB}$ (° C./W) |
|---|---|---|---|---|---|---|---|
| FIG. 13 (Cu) | 2 | 155.516 | 92.47 | 93.72 | 10.64 | 0.47 | 4.19 |
| FIG. 14 (Cu) | 2 | 147.716 | 86.43 | 90.41 | 9.41 | 1.48 | 2.85 |
| Improvement | — | −7.8 | −6.04 | −3.31 | −4.11 | 1.01 | −1.34 |
| Improvement (A) | — | −5.02% | −21.98% | −11.54% | −11.54% | 216.65% | −31.95% |

As used herein, the singular terms "a," "an," and "the" may include plural referents unless the context clearly dictates otherwise. For example, reference to an electronic device may include multiple electronic devices unless the context clearly dictates otherwise.

As used herein, the terms "connect," "connected," and "connection" refer to an operational coupling or linking. Connected components can be directly or indirectly coupled to one another through, for example, another set of components.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless otherwise specifically indicated herein, the order and grouping of the operations are not limitations of the present disclosure.

What is claimed is:

1. A conductive lid, comprising:
   a body comprising:
      a first portion extended from the body and bent toward a first direction and bent toward a surface of the body;
      a second portion extended from the body and bent toward the first direction; and
      a third portion extended from the second portion and bent toward a second direction different from the first direction.

2. The conductive lid of claim 1, wherein the body further comprises:
   a fourth portion extended from the body and bent toward the second direction;
   a fifth portion extended from the body and bent toward the second direction; and
   a sixth portion extended from the fifth portion and bent toward the first direction different from the second direction.

3. The conductive lid of claim 1, wherein the first direction is a clockwise direction.

4. The conductive lid of claim 3, wherein the second direction is a counterclockwise direction.

5. The conductive lid of claim 2, wherein each of the first portion and the fourth portion comprises a hole for accommodating a locking accessory.

6. The conductive lid of claim 2, wherein the first portion and the fourth portion are connected to a substrate.

7. The conductive lid of claim 2, wherein the third portion and the sixth portion are connected to an external contact.

8. The conductive lid of claim 2, wherein each of the third portion and the sixth portion comprises a hole for accommodating a locking accessory.

9. The conductive lid of claim 2, wherein the body further comprises a holder, and the holder is bent substantially perpendicular to the body.

10. The conductive lid of claim 9, wherein the holder comprises a card hook structure.

11. The conductive lid of claim 1, wherein the first portion is adjacent to the second portion, and the first portion and the second portion are alternately arranged around four sides of the body of the conductive lid.

12. The conductive lid of claim 1, wherein the thermal conductivity of the second, third, fifth and sixth portions is greater than the thermal conductivity of the first and fourth portions.

13. A semiconductor device package, comprising:
   a semiconductor component;
   a substrate, wherein the semiconductor component is disposed over the substrate; and
   a conductive lid, disposed over the semiconductor component, and comprising a body, wherein the body comprises:

a first portion extended from the body and bent toward a first direction and bent toward a surface of the body;

a second portion extended from the body and bent toward the first direction; and a third portion extended from the second portion and bent toward a second direction different from the first direction.

14. The semiconductor device package of claim 13, wherein the body further comprises:

a fourth portion extended from the body and bent toward the second direction; and a fifth portion extended from the body and bent toward the second direction; and a sixth portion extended from the fifth portion and bent toward the first direction different from the second direction.

15. A semiconductor device package, comprising:

a semiconductor component;

a first substrate, wherein the semiconductor component is disposed over the first substrate;

a second substrate, wherein the first substrate is disposed over the second substrate; and a conductive lid, comprising a body, wherein the body comprises: a first portion extended from the body and bent toward a first direction and bent toward a surface of the body, a second portion extended from the body and bent toward the first direction, and a third portion extended from the second portion and bent toward a second direction different from the first direction, wherein the first portion is connected to the first substrate, and the third portion is connected to the second substrate.

16. The semiconductor device package of claim 15, wherein the body further comprises:

a fourth portion extended from the body and bent toward the second direction; and a fifth portion extended from the body and bent toward the second direction; and a sixth portion extended from the fifth portion and bent toward the first direction different from the second direction.

17. The semiconductor device package of claim 16, wherein the fourth portion is connected to the first substrate, and the sixth portion is connected to the second substrate.

18. The semiconductor device package of claim 16, wherein the first portion comprises a hole for accommodating a locking accessory.

19. The semiconductor device package of claim 18, further comprising a heat spreader, disposed over the conductive lid, wherein the heat spreader is fixed to the conductive lid via the locking accessory.

20. The semiconductor device package of claim 15, wherein the thermal conductivity of the second, third, fifth and sixth portions is greater than the thermal conductivity of the first and fourth portions.

* * * * *